United States Patent
Chane-Ching et al.

(10) Patent No.: US 8,574,538 B2
(45) Date of Patent: Nov. 5, 2013

(54) SOLID MATERIAL IN THE DIVIDED STATE, PROCESS FOR THE PRODUCTION OF SUCH A MATERIAL, AND USE OF SUCH A MATERIAL IN A PHOTOVOLTAIC CELL

(75) Inventors: Jean-Yves Chane-Ching, Lacroix-Falgarde (FR); Arnaud Gillorin, Magnanville (FR); Xavier Marie, Pechabou (FR); Pascal Dufour, Villate (FR); Oana Zaberca, Toulouse (FR)

(73) Assignees: Universite Paul Sabatier Toulouse III, Toulouse (FR); Centre National de la Recherche Scientifique (C.N.R.S.), Paris (FR); Institut National des Sciences Appliquees de Toulouse, Toulouse (FR); Ecole Superieure des Beaux-Arts de la Reunion, Le Port (FR)

( * ) Notice: Subject to any disclaimer, the term of this patent is extended or adjusted under 35 U.S.C. 154(b) by 0 days.

(21) Appl. No.: 13/395,152

(22) PCT Filed: Sep. 8, 2010

(86) PCT No.: PCT/FR2010/051866
§ 371 (c)(1),
(2), (4) Date: May 17, 2012

(87) PCT Pub. No.: WO2011/030055
PCT Pub. Date: Mar. 17, 2011

(65) Prior Publication Data
US 2012/0231276 A1 Sep. 13, 2012

(30) Foreign Application Priority Data
Sep. 10, 2009 (FR) .................................... 09 04322

(51) Int. Cl.
C01B 17/00 (2006.01)
C01B 19/00 (2006.01)
H01B 1/00 (2006.01)
H01B 1/10 (2006.01)
H01L 31/042 (2006.01)
H01L 31/0264 (2006.01)
H02N 6/00 (2006.01)

(52) U.S. Cl.
USPC .......... 423/508; 423/511; 977/773; 977/775; 136/244; 136/252; 136/264; 252/519.14; 252/519.4; 257/E31.008; 438/84

(58) Field of Classification Search
USPC .......... 423/508, 511; 977/773, 775; 136/244, 136/252, 264; 252/519.14, 519.4; 257/E31.008; 438/84
See application file for complete search history.

(56) References Cited

U.S. PATENT DOCUMENTS

| 2012/0103420 A1* | 5/2012 | Yun et al. ...................... 136/264 |
| 2012/0138866 A1* | 6/2012 | Agrawal et al. ............. 252/501.1 |
| 2012/0219797 A1* | 8/2012 | Mitsumoto et al. ........... 428/402 |
| 2013/0045565 A1* | 2/2013 | Ahn et al. ...................... 438/95 |

FOREIGN PATENT DOCUMENTS

WO 2009/137637 11/2009

OTHER PUBLICATIONS

Todorov et al., "Cu2ZnSnS4 Films Deposited by a Soft-Chemistry Method", Thin Solid Films, Feb. 2, 2009, pp. 2541-2544, vol. 517, No. 7, Elsevier-Sequoia S.A., Lausanne, CH, XP025928679, Cited in ISR.
Tanaka et al., "Preparation of Cu2ZnSnS4 Thin Films by Sulfurizing Sol-Gel Deposited Precursors", Solar Energy Materials and Solar Cells, Jun. 5, 2007, pp. 1199-1201, vol. 91, No. 13, Elsevier Science Publishers, Amsterdam, NL, XP022104549, Cited in ISR.
Guo et al., "Synthesis of Cuznsns4 Nanocrystal Ink and Its Use in Solar Cells", Journal of the American Chemical Society, Jul. 31, 2009, pp. 11672-11673, vol. 131, XP002566027, Cited in ISR.
Steinhagen et al: "Synthesis of Cu2ZnSnS4 Nanocrystals for Use in Low Cost Photovoltaics", Journal of the American Chemical Society, Aug. 17, 2009, pp. 12554-12555, vol. 131, XP002566028, Cited in ISR.
Riha et al.: "Solution Based Synthesis and Characterization of Cu2ZnSnS4 Nanocrystals", Journal of the American Chemical Society, Aug. 12, 2009, pp. 12054-12055, vol. 131, XP002566029, Cited in ISR.
International Search Report dated Nov. 19, 2010 from PCT/FR2010/051866.

* cited by examiner

Primary Examiner — Timothy Vanoy
(74) Attorney, Agent, or Firm — Young & Thompson

(57) ABSTRACT

The invention relates to a solid material with the following formula (A): $(Cu^{+1}_{a-u}; Ag^{+1}_{u}; Zn^{+2}_{b-v-(y/2)}; Cd^{+2}_{v}; Sn^{+4}_{c-w-(y/2)}; {}^{1}X^{+4}_{w}; {}^{2}X^{+3}_{y}; S^{-2}_{x})(A)$, in which the solid material: is in divided state in the form of particles having a mean equivalent diameter of 15 nm to 400 nm; has, according to X-ray diffraction analysis of the solid material, a unique crystalline structure; is suitable for forming a stable dispersion of at least one solid material with formula (A) in a liquid, referred to as dispersion liquid, made up of at least one compound with a value of $\delta_p$ higher than 8 and a value of $\delta_H$ higher than 5.

20 Claims, 5 Drawing Sheets

Figure 1:
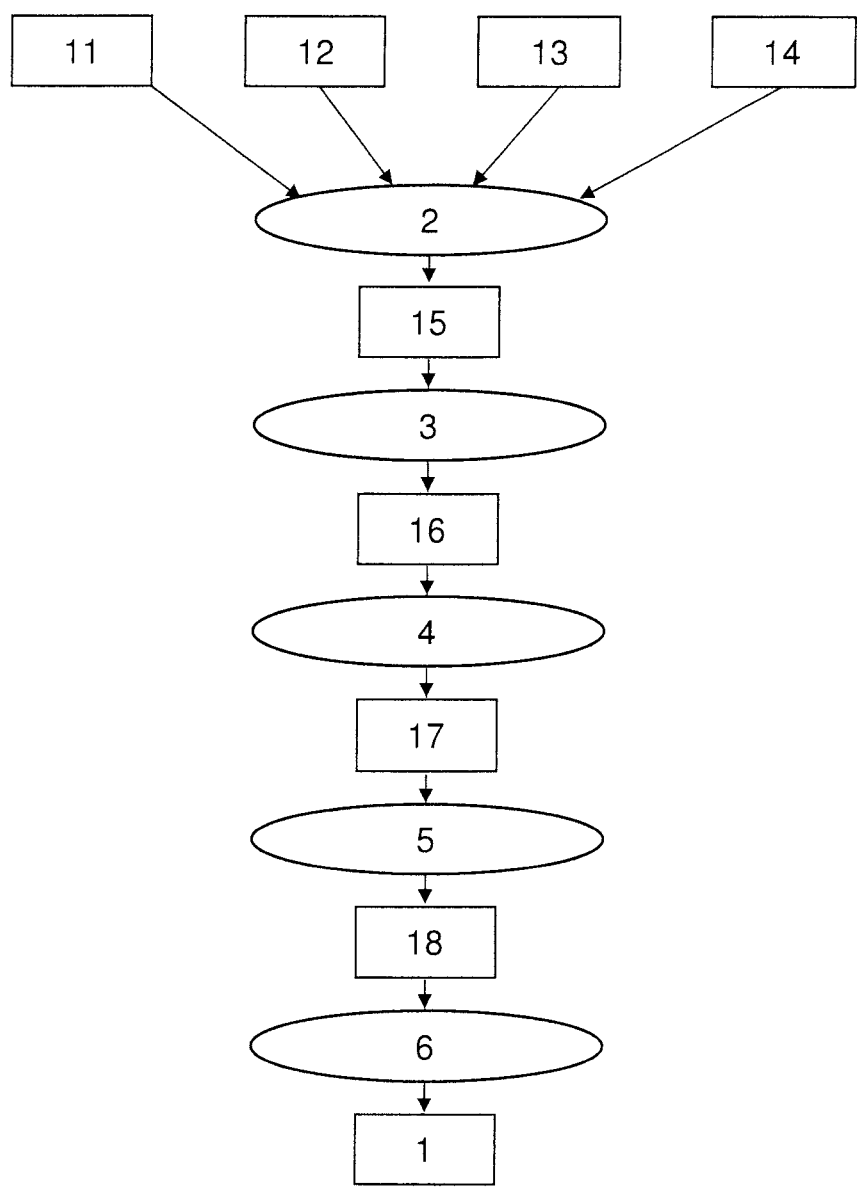

SOLID MATERIAL IN THE DIVIDED STATE, PROCESS FOR THE PRODUCTION OF SUCH A MATERIAL, AND USE OF SUCH A MATERIAL IN A PHOTOVOLTAIC CELL

The invention relates to a solid material in the divided state comprising a metal chalcogenide structure, to a process for the production of such a solid material, and to a dispersion of such a solid material in a liquid, especially a polar liquid. The invention relates also to the use of such a dispersion in the production of a photoelectric film, to a process for the production of such a photoelectric film, and to a photovoltaic cell comprising such a photoelectric film.

Such a solid material is used in the field of the exploitation of clean and renewable energies, especially solar energy, for the production of a photoelectric film of small thickness for a photovoltaic cell for photoelectric conversion.

Such a solid material can also be used in the production of a photoactive catalyst material which is suitable in particular for the decomposition by photocatalysis of polluting organic preparations and/or for the decomposition of water by photocatalysis in order to produce hydrogen.

Various processes and materials which are used for the production of thin photoelectric films are already known. In a first type of known technical solution, a photosensitive film is formed of a layer of silicon (see, for example, "Martinuzzi S., *Reflets de la physique*, Dec. 2007, 9-13"). Such a solution requires the production of solid silicon by reduction of silica, purification of the solid silicon, and the machining of thin layers of silicon from purified solid silicon. Such a production has a high cost, especially a high energy cost, which nowadays limits the development of silicon-based solar cells on a very large scale. Owing to its energy cost, such a manufacturing process does not preserve the environment.

FR 2 922 046 describes a second type of known solution in which a layer of photo-absorbing agent is formed from a semiconductor material comprising copper, indium, selenium and alternatively gallium. Such a continuous layer of absorbing agent necessarily comprises indium, which is a resource of natural origin and is likely to run out. Furthermore, such a continuous layer of photo-absorbing agent is obtained by the deposition of material in the vapour phase under reduced pressure or by electrodeposition. Such a process for obtaining a film of absorbing agent requires complex installations adapted for the atomic-scale deposition of material.

Katagiri (see Katagiri et al., (2008), *Applied Physics Express*, 1, 041201) proposes the formation of a $Cu_2ZnSnS_4$ film by radiofrequency sputtering using Cu, SnS and ZnS targets. Such a film has a conversion efficiency of solar energy into electrical energy of approximately 6.7% and does not allow the production on an industrial scale of photovoltaic sensors which are profitable from the energy point of view.

Todorov (see Todorov et al., (2009), *Thin Solid films*, 517, 2451-2544) describes the production of a $Cu_2ZnSnS_4$ film from nanoparticles of amorphous structure. Such an amorphous material does not permit control of the shrinkage during the densification by sintering of this amorphous material and the formation of a nanostructured film.

Steinhagen (see Steinhagen et al., (2009), *J. Am. Chem. Soc.*, 131, 12554-12555) describes $Cu_2ZnSnS_4$ particles of very small size—approximately 10 nm—obtained by controlled precipitation in oleylamine. Such a process, which requires removal of the oleylamine by washing, is not respective of the environment and does not allow particles larger than 10 nm to be obtained. Furthermore, such particles are not free of surfactant and do not have a crystal domain of large size. Furthermore, such particles do not permit the formation of a film of particles having a high raw density adapted to permit the formation by sintering of a photoelectric film of photovoltaic quality.

From Guo (see Guo et al., (2009), *Journal of American Chemical Society*, 131, 11672-11673) there is also known a nanocrystalline ink of $Cu_2ZnSnS_4$ for a solar cell. Such crystals are synthesized in oleylamine and form a stable dispersion in a non-polar solvent, especially in toluene. They do not permit the formation of a stable suspension of such nanocrystals in a polar liquid solvent.

The invention aims to remedy the disadvantages mentioned above by providing a solid material of high purity which can be used in the production of a photo-absorbing film which is of small thickness but which has a high photovoltaic conversion efficiency.

In particular, the invention relates to such a solid material which permits the formation of a submicron-scale and nanometer-scale structured film.

The invention relates also to a solid material adapted to permit the formation of a layer of particles of submicron size having a high raw density which is adapted to permit the formation of a photoelectric film by sintering of said layer.

The invention relates also to such a solid material which is of high crystallinity and is substantially free of hydrocarbon compounds of the amphiphilic surface-active (surfactant) type.

In particular, the invention relates to such a solid material which does not require, for its obtainment, the use of an amphiphilic hydrocarbon compound, especially a surface-active compound, in particular a fatty amine of the oleylamine type. The invention relates, therefore, to such a solid material which is adapted for dispersion in polar liquid solvents.

The invention aims also to achieve all those objects at low cost, by proposing such a solid material which has a low production cost and is produced from conventional and/or inexpensive chemical components.

The invention aims also to propose a process for the production of such a solid material which is compatible with production, profitability and safety constraints on an industrial scale.

The invention relates also to such a process which does not require the use of particle growth inhibiting compounds, in particular of amphiphilic surface-active compounds (surfactants).

The invention aims also to propose such a process which produces only a small amount of waste, which is respectful of the environment, and which satisfies sustainable development criteria.

The invention additionally relates to such a process which preserves employees' working practices, which is easy to use and which involves only a small number of operations.

The invention relates also to the use of such a solid material in the production of a nanostructured photoelectric film which is substantially free of structural defects liable to form electron traps.

The invention relates also to a dispersion of such a solid material in a liquid medium which can be applied by coating to the surface of a substrate in order to permit the formation of a thin semiconducting layer of said solid material without requiring either an in vacuo deposition, especially low-pressure sputtering, process or electrodeposition.

The invention relates further to such a dispersion which is stable over time, especially to settlement.

The invention relates in particular to a dispersion of such a solid material in the divided state in a polar liquid medium.

The invention relates also to the use of such a dispersion in the production of a thin film applied to the surface of a substrate, in particular of a substrate of complex shape, especially a non-planar substrate.

The invention relates in particular to the use of such a dispersion in the production of a photoelectric film, especially a photoelectric film of a photovoltaic cell.

The invention relates also in particular to the use of such a dispersion in the production of a photoelectric film of a photocatalytic material.

To that end, the invention relates to a solid material of the following formula (A):

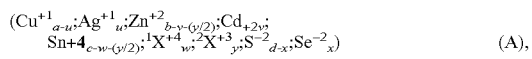

$$(Cu^{+1}_{a-u}; Ag^{+1}_u; Zn^{+2}_{b-y-(y/2)}; Cd_{+2y}; Sn+4_{c-w-(y/2)}; {}^1X^{+4}_w; {}^2X^{+3}_y; S^{-2}_{d-x}; Se^{-2}_x) \quad (A),$$

wherein:

a, b, c, d, u, v, w, x and y and their arithmetic combinations are real numbers which represent the molar proportion of each element with which each number is associated in formula (A)—chosen especially so as to satisfy the electroneutrality of the material—and are such that:

1.6<a<2.4;
0.6<b<1.2;
0.6<c<1.2;
3.5<d<4.5; and u, v, w, x and y, independently of one another, belong to the set of real numbers belonging to the interval [0; 0.5], and
$^1X^{+4}$ is chosen from the group formed of the cations of titanium (Ti), the cations of zirconium (Zr) and the cations of lead (Pb),
$^2X^{+3}$ is chosen from the group formed of the cations of gallium (Ga), the cations of indium (In) and the cations of yttrium (Y);

said solid material:
is in the divided state in the form of particles having a mean equivalent diameter of from 15 nm to 400 nm, and
exhibits, by analysis of said solid material by X-ray diffraction, a single crystal structure, and
is adapted to be able to form a stable dispersion of at least one solid material of formula (A) in a liquid, called the dispersion liquid, formed of at least one compound having a $\delta_P$ value greater than 8, in particular a $\delta_P$ value of from 8 to 20, and a $\delta_H$ value greater than 5, in particular a $\delta_H$ value of from 5 to 40.

In the following, the expression "equivalent diameter" of a particle denotes the diameter of the circle of the same area as the orthogonal projection of said particle on a notional plane tangent to said particle. In particular, the "mean equivalent diameter" of the particles of a composition of particles can be evaluated by methods known per se, especially by transmission electron microscopy or by high-resolution electron microscopy. The mean equivalent diameter of the particles of a composition of particles is determined by measuring the diameter of at least 50 particles visualized on transmission electron microscopy slides, for example at a magnification factor of from 60,000 to 200,000. The median of the histogram of the distribution of the measured particle sizes is the mean equivalent diameter of the particles of the composition of particles.

Such values of $\delta_P$ and $\delta_H$ are values which are known to the person skilled in the art and are described, for example, in the work "Handbook of solubility parameters and other cohesive parameters, 1983, CRC press, p. 153-157". In particular, $\delta_P$ and $\delta_H$ are solubility parameters defined by Hidelbrandt, the parameter $\delta_P$ being associated with a polar interaction force and the parameter $\delta_H$ being associated with a hydrogen interaction force.

Advantageously, the dispersion liquid is formed of a compound having a $\delta_P$ value greater than 8, in particular a $\delta_P$ value of from 8 to 20, and a $\delta_H$ value greater than 5, in particular a $\delta_H$ value of from 5 to 40.

Advantageously, the dispersion liquid is formed of at least one compound the sum $(\delta_P+\delta_H)$ of which is greater than 22. In particular, the dispersion liquid is formed of a single compound of which the sum $(\delta_P+\delta_H)$ is greater than 22.

Advantageously, the solid material of formula (A) is adapted to be able to form a stable dispersion in a liquid, called the dispersion liquid, formed of at least one polar solvent compound.

Advantageously, the dispersion liquid is chosen from the group formed of solvents that develop strong polar interactions $(\delta_P)$ and strong hydrogen interactions $(\delta_H)$.

In such a solid material of formula (A) in the divided state, the particles exhibit a statistical size distribution in which less than 10% of the particles have a size greater than twice the median of the size distribution and less than 10% of the particles have a size less than half the median of the size distribution. In the following, the term particle denotes an individualized solid entity. Such a particle can be in the form of a single elementary crystallite forming an individualized particle or in the form of a plurality of crystallites associated by aggregation within said individualized particle. In any case, the plurality of crystallites exhibits a single structure by X-ray diffraction.

Analysis of the structure of a solid material of formula (A) according to the invention by X-ray diffraction shows an X-ray diffraction pattern which matches the pattern for kesterite ($Cu_2ZnSnS_4$, JCPDS no. 00-026-0575 referenced in "Joint Committee on Powder Diffraction Standards". In particular, the X-ray diffraction pattern of a solid material of formula (A) according to the invention does not exhibit a line attributable to structures of the type $Cu_2S$ (chalcosine, JCPDS no. 01-072-2276), CuS (coveline, JCPDS no. 01-076-1725), SnS (tin sulfide, JCPDS no. 00-040-1465), $Cu_3SnS_4$ (petrukite, JCPDS no. 00-036-0217), ZnS (wurtzite, JCPDS no. 00-036-1450, JCPDS no. 01-072-0163, JCPDS no. 01-075-1534), $Cu_9S_8$ (yarrowite, JCPDS no. 00-036-0379).

In a solid material according to the invention, formula (A) describes the chemical composition of the unit cell forming the single crystal structure of said solid material. Such a chemical composition can be determined by chemical analysis by methods known per se to the person skilled in the art.

According to a particular embodiment of the invention, the particles of a solid material of formula (A) according to the invention are particles of generally isotropic shape (without a preferred extension direction), the mean equivalent diameter of which is from 15 nm to 400 nm.

In particular, the particles of a solid material of formula (A) according to the invention have, in an orthonormal spatial reference frame, three orthogonal dimensions of the same order of magnitude.

Advantageously and according to the invention, the particles constituting the solid material of formula (A) have a mean equivalent diameter of from 15 nm to 400 nm, especially from 25 nm to 300 nm. The mean equivalent diameter of the particles can be from 15 nm to 300 nm, especially from 15 to 100 nm, preferably from 25 nm to 100 nm.

Advantageously and according to the invention, the elements constituting the solid material of formula (A) are so chosen that, at their oxidation number in the solid material of formula (A), each of the elements has an electron distribution in which the outer shell d is either an empty outer shell d or a full outer shell d, that is to say an outer shell d having 10 electrons.

The cations $Cd^{+2}$, $^1X^{+4}$ and $^2X^{+3}$ are cations of doping elements of the solid material of formula (A), adapted so that they do not allow an electronic transition between two orbitals d of said cations $Cd^{+2}$, $^1X^{+4}$ and $^2X^{+3}$.

The cations $Cd^{+2}$, $^1X^{+4}$ and $^2X^{+3}$ are so chosen that, at the oxidation number of each of the cations $Cd^{+2}$, $^1X^{+4}$ and $^2X^{+3}$ in the solid material of formula (A), the electron distribution of each cation $Cd^{+2}$, $^1X^{+4}$ and $^2X^{+3}$ has either an empty outer shell d, especially the shells 3d, 4d and 5d, or a full outer shell, that is to say an outer shell having 10 electrons.

Advantageously and according to the invention, the particles are constituted solely by the solid material of formula (A). In particular, the particles constituting the solid material of formula (A) according to the invention are free of surface-active hydrocarbon compound, in particular free of fatty amines, especially oleylamine, and fatty acids, especially carboxylic acids, sulfonic acids, etc.

In particular, the particles constituted by the solid material of formula (A) according to the invention form a stable dispersion in polar solvents. In fact, such a stable dispersion of said solid material of formula (A) in the dispersion liquid is adapted so that more than 70 wt. %, especially more than 80 wt. %, preferably more than 90 wt. %, of the solid material of formula (A) remains in suspension in the dispersion liquid after a period of 2 hours, preferably of 6 hours, without said dispersion being stirred. Such particles according to the invention do not form aggregates—which tend to minimize the surface area of the particles that is exposed to the dispersion liquid—as soon as they are placed in a polar dispersion medium and therefore do not settle during that period of 2 hours, especially of 6 hours.

In particular, such a stable dispersion of said solid material of formula (A) in the dispersion liquid is adapted so that more than 70 wt. %, especially more than 80 wt. %, preferably more than 90 wt. %, of the solid material of formula (A) remains in suspension in the dispersion liquid after a period of 48 hours (2 days), preferably of 96 hours (4 days), without said dispersion being stirred.

The inventors have observed that the particles of a solid material of formula (A) according to the invention form a stable suspension in polar solvents, while the particles of the prior art disperse in non-polar solvents, especially in toluene, showing that the nanocrystals of the prior art have a surface layer of a hydrophobic and non-polar nature enclosing said nanocrystals.

Advantageously and according to the invention, the dispersion liquid is formed of at least one compound chosen from the group formed of ethyl alcohol ($\delta_P=8.8$, $\delta_H=19.4$), acetonitrile ($\delta_P=18$, $\delta_H=6.1$), ethylene glycol ($\delta_P=11$, $\delta_H=26$), dimethyl sulfoxide ($\delta_P=16.4$, $\delta_H=10.2$), propylene glycol ($\delta_P=9$, $\delta_H=22$), methanol ($\delta_P=13$, $\delta_H=21$) and dimethylformamide ($\delta_P=14$, $\delta_H=11$).

Advantageously, the dispersion liquid is formed of one compound selected from the group formed of ethyl alcohol ($\delta_P=8.8$, $\delta_H=19.4$), acetonitrile ($\delta_P=18$, $\delta_H=6.1$), ethylene glycol ($\delta_P=11$, $\delta_H=26$), dimethyl sulfoxide ($\delta_P=16.4$, $\delta_H=10.2$), propylene glycol ($\delta_P=9$, $\delta_H=22$), methanol ($\delta_P=13$, $\delta_H=21$) and dimethylformamide ($\delta_P=14$, $\delta_H=11$).

Advantageously, the dispersion liquid is formed by a mixture of a plurality of compounds selected from the group formed of ethyl alcohol ($\delta_P=8.8$, $\delta_H=19.4$), acetonitrile ($\delta_P=18$, $\delta_H=6.1$), ethylene glycol ($\delta_P=11$, $\delta_H=26$), dimethyl sulfoxide ($\delta_P=16.4$, $\delta_H=10.2$), propylene glycol ($\delta_P=9$, $\delta_H=22$), methanol ($\delta_P=13$, $\delta_H=21$) and dimethylformamide ($\delta_P=14$, $\delta_H=11$).

Advantageously, the dispersion liquid is chosen from the group formed of solvents that develop strong polar interactions ($\delta_P$) and strong hydrogen interactions ($\delta_H$). Accordingly, there is chosen more particularly at least one solvent from the group formed of ethyl alcohol ($\delta_P=8.8$, $\delta_H=19.4$), acetonitrile ($\delta_P=18$, $\delta_H=6.1$), ethylene glycol ($\delta_P=11$, $\delta_H=26$) and dimethyl sulfoxide ($\delta_P=16.4$, $\delta_H=10.2$).

Advantageously, the dispersion liquid is a liquid of high purity and low ionic strength.

Advantageously, the particles of the solid material of formula (A) according to the invention dispersed in the dispersion liquid are surface-charged particles. This surface charge is determined in a manner known to the person skilled in the art by electrophoretic mobility measurements. In particular, the dispersion liquid of low ionic strength is adapted so that it does not produce a screening constant with respect to the charges of the particles.

Advantageously and according to the invention, the solid material of formula (A) has, in absorption spectroscopy, a forbidden band width of from 0.9 eV to 2.8 eV, especially from 1.0 eV to 1.8 eV, preferably from 1.3 eV to 1.6 eV. Advantageously, the solid material of formula (A) has, in absorption spectroscopy, a forbidden band width substantially of approximately 1.5 eV.

The forbidden band width of such a solid material of formula (A) is determined by absorption spectroscopy by means of a UV-VIS-NIR absorption spectrometer, that is to say a spectrometer which covers the ultraviolet, visible and near-infrared wavelength ranges. The value of the energy corresponding to the forbidden band is determined experimentally by the method described, for example, in "*Material Research Bulletin*, (2008), 43, 2742-2750". To that end, the variation in the absorbance of the dispersion of particles is plotted and the value of the coefficient of absorption α is determined therefrom. The curve $(\alpha.h.\nu)^2$ is plotted as a function of the energy (h.ν), where:

h is Planck's constant,

α is the coefficient of absorption,

ν is the frequency of the incident radiation, the straight line D tangent to the curve (α.h.ν) is plotted as a function of the energy (h.ν) towards the high energies. The straight line D cuts the x-axis (energy) at the value (Eg) of the energy corresponding to the forbidden band.

Advantageously, the forbidden band width of such a solid material of formula (A) is determined on a film of particles obtained by evaporation at ambient temperature of the dispersion liquid of a dispersion of particles according to the invention on a glass substrate.

Advantageously, the forbidden band width measured for particles of a solid material of formula (A) whose diameter is from 15 nm to 400 nm is from 0.9 eV to 2.8 eV. Advantageously, the forbidden band width measured for particles of a solid material of formula (A) whose diameter is from 25 nm to 300 nm is from 1.0 eV to 1.8 eV. Advantageously, the forbidden band width measured for particles of a solid material of formula (A) whose diameter is from 25 nm to 100 nm and which have a single crystal domain (monocrystalline particles) of a size substantially of approximately that of the mean equivalent diameter of the particle is from 1.3 eV to 1.6 eV.

Advantageously and according to the invention, the particles constituting the solid material of formula (A) have at least one domain, called the crystal domain, which has a mean size, measured by X-ray diffraction, of from 4 nm to 100 nm, especially from 5 nm to 80 nm, said crystal domain having the single crystal structure. The mean size of the crystal domain(s) of the particles forming the solid material of formula (A) according to the invention is determined by the person skilled in the art by methods of X-ray diffraction analysis (DRX) known per se, especially by application of the Debye-Scherrer formula.

Advantageously and according to the invention, the solid material of formula (A) has, by Raman spectroscopy, a scattering line, called the primary line, which has a maximum scattering intensity at a wave number value of from 310 cm$^{-1}$ to 340 cm$^{-1}$, especially from 330 cm$^{-1}$ to 340 cm$^{-1}$, in particular substantially of approximately 336 cm$^{-1}$.

Advantageously and according to the invention, the primary line has a line width at half-height of from 5 cm$^{-1}$ to 60 cm$^{-1}$, especially from 10 cm$^{-1}$ to 60 cm$^{-1}$.

Advantageously, in a first variant of a material according to the invention, the solid material of formula (A) is formed of polycrystalline particles. In such polycrystalline particles, the mean equivalent diameter of the crystal domain(s) of the particles constituting the solid material of formula (A), measured by X-ray diffraction, is less than the mean equivalent diameter of said particles.

In this first variant, advantageously and according to the invention, the solid material of formula (A) is formed of particles which have a mean equivalent diameter of from 15 nm to 400 nm and the mean size of the crystal domain of which is from 4 nm to 20 nm.

Advantageously, in this first variant of a material according to the invention, the solid material of formula (A) has, by Raman spectroscopy, a scattering line, called the primary line, which has a maximum scattering intensity at a wave number value of from 330 cm$^{-1}$ to 340 cm$^{-1}$, especially substantially of approximately 336 cm$^{-1}$, and a line width at half-height of from 10 cm$^{-1}$ to 60 cm$^{-1}$.

Advantageously and according to a second variant of the invention, the solid material of formula (A) is formed of polycrystalline particles which have a mean equivalent diameter of from 15 nm to 300 nm and the mean size of the crystal domain of which is from 15 nm to 80 nm.

In such polycrystalline particles, the mean diameter of the crystal domain(s) of the particles constituting the solid material of formula (A), measured by X-ray diffraction, is less than the mean equivalent diameter of said particles.

Advantageously, in this second variant of a material according to the invention, the solid material of formula (A) has, by Raman spectroscopy, a scattering line, called the primary line, which has a maximum scattering intensity at a wave number value of from 330 cm$^{-1}$ to 340 cm$^{-1}$, especially substantially of approximately 336 cm$^{-1}$, and a line width at half-height of from 5 cm$^{-1}$ to 40 cm$^{-1}$.

Advantageously and according to a third variant of the invention, the mean size of the crystal domain(s) of the particles constituting the solid material of formula (A), measured by X-ray diffraction, is substantially of the order of magnitude of the mean equivalent diameter of said particles.

Advantageously, in this third variant of a solid material of formula (A) according to the invention, the particles constituting the solid material of formula (A) are monocrystalline particles. Such monocrystalline particles have a mean equivalent diameter, determined by electron microscopy, which is of the order of magnitude of, especially substantially equal to, the mean diameter of the crystal domains determined by X-ray diffraction. Advantageously, the solid material of formula (A) is formed of monocrystalline particles.

In this third variant, advantageously and according to the invention, the solid material of formula (A) is formed of particles which have a mean equivalent diameter of from 25 nm to 100 nm, especially from 30 nm to 60 nm, and the mean size of the crystal domain of which is from 25 nm to 100 nm.

Advantageously, in this third variant of a material according to the invention, the solid material of formula (A) has, by Raman spectroscopy, a scattering line, called the primary line, which has a maximum scattering intensity at a wave number value of from 330 cm$^{-1}$ to 340 cm$^{-1}$, especially substantially of approximately 336 cm$^{-1}$, and a line width at half-height of from 5 cm$^{-1}$ to 18 cm$^{-1}$.

Advantageously and according to the invention, the solid material of formula (A) has, by Raman spectroscopy, a secondary scattering line which has a maximum scattering intensity at a wave number value of from 260 cm$^{-1}$ to 295 cm$^{-1}$, especially from 260 cm$^{-1}$ to 285 cm$^{-1}$.

Advantageously, the solid material of formula (A) has, by Raman spectroscopy, an additional secondary scattering line which has a maximum scattering intensity at a wave number value of from 355 cm$^{-1}$ to 375 cm$^{-1}$, especially from 360 cm$^{-1}$ to 370 cm$^{-1}$, preferably approximately 365 cm$^{-1}$.

Advantageously, it is possible for the content d of sulfur of a solid material of formula (A) to be greater than 4, given the residual presence of decomposition products of the precursor of sulfur.

In a particular embodiment of the invention, the solid material is of formula (A) in which:
1.6<a<2.4;
u=0;
0.6<b<1.2;
v=0;
0.6<c<1.2;
w=0;
y=0;
3.5<d<4.5;
x=0.

In an embodiment, advantageously and according to the invention, the solid material is of the following formula (A$_1$):

$(Cu^{+1}{}_2;Zn^{+2}{}_1;Sn^{+4}{}_1;S^{-2}{}_4)$     (A$_1$)

derived from formula (A) in which a=2; u=0; b=1; v=0; c=1; w=0; y=0; d=4 and x=0.

In another particular embodiment of the invention, the solid material is of formula (A) in which:
1.6<a<2.4;
u=0;
0.6<b<1.2;
0≤v<0.5;
0.6<c<1.2;
w=0;
y=0;
3.5<d<4.5;
x=0.

In this embodiment, advantageously and according to the invention, the solid material is of the following formula (A$_2$):

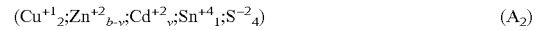
$(Cu^{+1}{}_2;Zn^{+2}{}_{b-v};Cd^{+2}{}_v;Sn^{+4}{}_1;S^{-2}{}_4)$     (A$_2$)

derived from formula (A) in which a=2; u=0; 0.6<b<1.2; 0≤v<0.5; c=1; w=0; y=0; d=4 and x=0.

More particularly and advantageously according to the invention, the solid material is a doped material of formula (A) in which:
a=2;
u=0;
b=1;
0≤v<0.5;
c=1;
w=0;
y=0;
d=4;
x=0.

Advantageously and according to the invention, the solid material is a doped material of formula ($A_3$):

$$(Cu^{+1}{}_2; Zn^{+2}{}_{0.75}; Cd^{+2}{}_{0.25}; Sn^{+4}{}_1; S^{-2}{}_4) \quad (A_3)$$

derived from formula (A) in which a=2; u=0; b=1; v=0.25; c=1; w=0; y=0; d=4 and x=0.

In another particular embodiment of the invention, the solid material is a doped material of formula (A) in which:
1.6<a<2.4;
u=0;
0.6<b<1.2;
0≤v<0.5;
0.6<c<1.2;
w=0;
0≤y<0.5;
3.5<d<4.5;
x=0;
$^2X^{+3}$ is chosen from the group formed of the cations of gallium (Ga), the cations of indium (In) and the cations of yttrium (Y).

In this particular embodiment of the invention, advantageously the doped solid material is of formula ($A_4$):

$$(Cu^{+1}{}_2; Zn^{+2}{}_{0.75}; Ga^{+3}{}_{0.5}; Sn^{+4}{}_{0.75}; S^{-2}{}_4) \quad (A_4)$$

derived from formula (A) in which $^2X^{+3}$ is $Ga^{+3}$; a=2; u=0; b=1; v=0; c=1; w=0; y=0.5; d=4 and x=0.

In another particular embodiment of the invention, the solid material is a doped material of formula (A) in which:
1.6<a<2.4;
u=0;
0.6<b<1.2;
v=0;
0.6<c<1.2;
0≤w<0.5;
w=0;
3.5<d<4.5;
x=0;
$^1X^{+4}$ is chosen from the group formed of the cations of titanium (Ti), the cations of zirconium (Zr) and the cations of lead (Pb).

In this particular embodiment of the invention, advantageously the solid material is a doped material of formula ($A_5$):

$$(Cu^{+1}{}_2; Zn^{+2}{}_1; Sn^{+4}{}_{c-w}; Zr^{+4}{}_w; S^{-2}{}_4) \quad (A_5)$$

derived from formula (A) in which $^1X^{+4}$ is $Zr^{+4}$; a=2; u=0; b=1; v=0; c=1; 0≤w<0.5; y=0; d=4 and x=0.

In another particular embodiment of the invention, the solid material is a doped material of formula ($A_6$):

$$(Cu^{+1}{}_{a-u}; Ag^{+1}{}_u; Zn^{+2}{}_b; Sn^{+4}{}_c; S^{-2}{}_d) \quad (A_6)$$

derived from formula (A) in which 1.6<a<2.4; 0≤u<0.5; 0.6<b<1.2; v=0; 0.6<c<1.2; w=0; y=0; 3.5<d<4.5 and x=0.

In another particular embodiment of the invention, the solid material is a doped material of formula ($A_7$):

$$(Cu^{+1}{}_a; Zn^{+2}{}_b; Sn^{+4}{}_c; S^{-2}{}_{d-x}; Se^{-2}{}_x) \quad (A_7)$$

derived from formula (A) in which 1.6<a<2.4; u=0; 0.6<b<1.2; v=0; 0.6<c<1.2; w=0; y=0; 3.5<d<4.5 and 0≤x<0.5.

Advantageously and according to the invention, a solid material of formula (A) can have at least one of the following features:
a portion of the cations of copper ($Cu^{+1}$) is replaced by cations of silver ($Ag^{+1}$),
a portion of the cations of zinc ($Zn^{+2}$) is replaced by cations of cadmium ($Cd^{+2}$),
a portion of the cations of tin ($Sn^{+4}$) is replaced by cations of titanium ($Ti^{+4}$), cations of zirconium ($Zr^{+4}$) or cations of lead ($Pb^{+4}$),
a same portion of the cations of zinc ($Zn^{+2}$) and of the cations of tin ($Sn^{+4}$) is replaced by cations chosen from the group formed by the cations of gallium ($Ga^{+3}$), the cations of indium ($In^{+3}$) and the cations of yttrium ($Y^{+3}$),
a portion of the anions of sulfur ($S^{-2}$) is replaced by anions of selenium ($Se^{-2}$).

The invention extends also to a process for obtaining a solid material of formula (A).

The invention relates also to a process for obtaining a solid material of formula (A) according to the invention, said process comprising the following steps:
(a) at least one precursor of each element constituting the solid material of formula (A) is chosen;
(b) a solid composition, called the composition of precursors, is prepared by mixing the precursor(s) of each element constituting the solid material of formula (A); and then
(c) the composition of precursors is placed in a vessel under an inert gas atmosphere at a temperature of approximately ambient temperature;
(d) the composition of precursors is heated during a step, called the molten salt step, at a rate of increase of the temperature which is from 0.5° C./minute to 10.0° C./minute and which is adapted so that the temperature of the vessel reaches a synthesis temperature of from 250° C. to 500° C., especially from 350° C. to 450° C., and said synthesis temperature is maintained for a synthesis period of from 2 hours to 36 hours, especially from 4 hours to 26 hours, so as to form a recrystallized material having a single structure by X-ray diffraction; and then
(e) after cooling of the recrystallized material, a treatment of separation of a solid material of formula (A) that is free of precursors is carried out;
(f) following steps (a) to (e), the solid material of formula (A) free of precursors is subjected to a step of reduction of its particle size, especially by grinding;
(g) and there is then carried out a step of selection of the particles of the material whose particle size has been so reduced, adapted to retain the particles having the smallest particle size.

The inventors have observed that such a molten salt treatment of a composition of precursors at a temperature of from 250° C. to 500° C., especially from 350° C. to 450° C., permits the formation of crystalline and nanometer-sized particles of a solid material of formula (A) by precipitation or, preferably, by dissolution/re-precipitation accompanied by recrystallization of said composition of precursors. Wholly surprisingly, the inventors have observed that such a molten salt treatment of a composition of precursors, especially of a powder of hardly crystallized precursors, allows the size and crystallographic quality of the crystal domains of the particles constituting the composition of precursors to be increased, without substantial modification of the particle size of the powder.

Although no explanation is known for this phenomenon, the inventors think that, on heating of said precursors, the water bonded constitutively to the cationic and anionic precursors causes bubbling of the molten reaction medium due to the constitutive water and rearrangement with expansion of the reaction volume.

Advantageously and according to the invention, in such a process:

the respective molar proportions (a', u', b', v', c', y' and w') of the elements Cu, Ag, Zn, Cd, Sn, $^1$X and $^2$X constituting the composition of precursors are in the respective stoichiometric proportions a, u, b, v, c, y and w of the solid material of formula (A), the respective molar proportions (d' and x') of the elements S and Se constituting the composition of precursors are such that the sum (d'+x') is from 5 to 30, especially from 8 to 25, said values (a', u', b', v', c', y', w', d' and x') being adapted to satisfy the condition of electroneutrality of the solid material of formula (A).

Advantageously and according to the invention:

the precursor(s) of copper (Cu) is/are chosen from the group formed of copper(I) chloride (CuCl), copper(II) chloride dihydrate (CuCl$_2$2H$_2$O), copper nitrate (Cu(NO$_3$)$_2$), copper acetate ((CH$_3$COO)$_2$Cu), freshly prepared Cu hydroxides and freshly prepared Cu (oxy)hydroxides;

the precursor(s) of tin (Sn) is/are chosen from the group formed of stannic chloride hydrate (SnCl$_4$5H$_2$O), stannic acetate ((CH$_3$COO)$_4$Sn), freshly prepared Sn$^{+4}$ hydroxides and freshly prepared Sn$^{+4}$ (oxy)hydroxides;

the precursor(s) of zinc (Zn) is/are chosen from the group formed of zinc chloride (ZnCl$_2$), zinc acetate ((CH$_3$COO)$_2$Zn), freshly prepared Zn$^{+2}$ hydroxides and freshly prepared Zn$^{+2}$ (oxy)hydroxides;

the precursor(s) of anion(s) is/are chosen from the group formed of potassium thiocyanate (K—S—C≡N), thiourea (S=C(NH$_2$)$_2$), sodium sulfide hydrate (Na$_2$S, 9H$_2$O), sodium sulfide (Na$_2$S), potassium selenocyanate (K—Se—C≡N) and selenourea (Se=C(NH$_2$)$_2$);

the precursor(s) of doping agent(s) is/are chosen from the group formed of silver nitrate (AgNO$_3$), gallium chloride (GaCl$_3$), cadmium chloride (CdCl$_2$), gallium nitrate (Ga(NO$_3$)$_3$), cadmium nitrate (Cd(NO$_3$)$_3$), cadmium iodide (CdI$_2$) and lead acetate ((CH$_3$COO)$_4$Pb), yttrium nitrate (Y(NO$_3$)$_3$), gallium (oxy)hydroxides, lead (oxy)hydroxides and yttrium (oxy)hydroxides.

In a first variant of a process, advantageously and according to the invention, the composition of precursors is subjected directly to the molten salt step.

In this first variant of a process according to the invention, a mixture of the precursors of the solid material is prepared and the mixture is then subjected to a molten salt treatment according to the invention. There is obtained a composition of particles which have a mean equivalent diameter of from 15 nm to 400 nm, especially from 25 nm to 300 nm, in particular from 25 nm to 100 nm, and which are formed of a solid material of formula (A), said solid material being highly crystalline.

In a second variant of a process, advantageously and according to the invention, after step (a):

a solution, called the solution of precursors, is prepared by mixing the precursor(s) of each element constituting the solid material of formula (A) in a liquid medium, called the solvent medium, comprising at least one liquid compound chosen from the group formed of ethylene glycol, acetonitrile and alcohols, especially ethyl alcohol and isopropanol; and then a treatment, called solvothermal treatment, of said solution of precursors is carried out in a closed reactor at a temperature of from 140° C. to 250° C., especially from 180° C. to 220° C., for a period of from 8 hours to 24 hours, especially from 12 hours to 18 hours; and then a step of solid/liquid separation of a solid formed during the solvothermal treatment in said solution of precursors is carried out; and then grinding of said solid is carried out in order to form a finely divided powder; and then the finely divided powder is subjected to the molten salt step.

In the solvothermal treatment, the pressure inside the closed reactor is the autogenous pressure due to the temperature increase of the solution of precursors in the solvent medium.

In the solution of precursors, the respective molar proportions (a", u", b", v", c", y" and w") of the elements Cu, Ag, Zn, Cd, Sn, $^1$X and $^2$X constituting the solution of precursors are in the respective stoichiometric proportions a, u, b, v, c, y and w of the solid material of formula (A);

the respective molar proportions (d' and x') of the elements S and Se constituting the solution of precursors are such that the sum (d'+x') is from 4 to 15, especially from 5 to 12, said values (a", u", b", v", c", y", w", d" and x") being adapted to allow the condition of electroneutrality of the solid material of formula (A) obtained by the process according to the invention to be satisfied.

In this second variant, the finely divided powder is then subjected to the successive subsequent steps (c), (d), (e), (f) and (g) of a molten salt treatment of a process according to the invention.

In this second variant of a process according to the invention, there is first formed a finely divided powder formed of a material according to the invention which has, by X-ray diffraction, a crystalline phase of a mean size of from 4 nm to 12 nm and a proportion of amorphous material. The particles of the finely divided powder have a mean equivalent diameter of from 15 nm to 400 nm, especially from 25 nm to 300 nm, in particular from 25 nm to 250 nm.

The inventors have observed that the molten salt treatment of such a finely divided powder, at a temperature of from 250° C. to 500° C., especially from 350° C. to 450° C., permits the formation of the nanometer-sized particles according to the invention having a single crystal domain of large size.

In this second variant of a process according to the invention, there is advantageously obtained a solid material of formula (A) which has a proportion of monocrystalline particles greater than 80%, said particles having a mean equivalent diameter of from 25 nm to 100 nm and a single crystal domain size of from 25 nm to 100 nm.

The inventors have observed that a high concentration of precursor(s) of anions chosen from the group formed of sulfur (S) and selenium (Se) during the solvothermal treatment of said solution of precursors is adapted to permit the formation of a finely divided solid in which the particles are of small mean equivalent diameter and have, by analysis by RX diffraction, organized crystal domains of small size.

Advantageously, the solution of precursors further comprises at least one reducing agent, especially ascorbic acid, in a molar proportion reducing agent/copper (Cu) of from 0.5 to 1.5, preferably from 0.8 to 1.2, adapted to permit the reduction of the Cu$^{++}$ ions into Cu$^+$ ions in said solution of precursors.

Advantageously, the molar concentration of Cu$^{++}$ ions in the solution of precursors is from 0.02 M to 0.2 M, preferably from 0.02 M to 0.05 M.

Advantageously, the solution of precursors comprises a quantity of at least one basic compound capable of producing hydroxide ions in said solution of precursors. Advantageously, the basic compound is chosen from the group formed of sodium hydroxide, ammonia and tetramethylammonium hydroxide (TMaOH).

Advantageously and according to the invention, during the molten salt step, the rate of increase of the temperature of said vessel is from 1° C./minute to 2° C./minute and the synthesis temperature is from 350° C. to 460° C.

Advantageously and according to the invention, the inert gas is chosen from the group formed of argon (Ar) and molecular nitrogen ($N_2$).

The invention relates also to a solid material of formula (A) obtained by a process according to one of the variants of the invention.

The invention relates further to the use of a solid material of formula (A) according to the invention, in which there is prepared a dispersion of said solid material of formula (A) in a liquid medium, called the dispersion liquid, formed of at least one compound having a $\delta_P$ value greater than 8, in particular a $\delta_P$ value of from 8 to 20, and a $\delta_H$ value greater than 5, in particular a $\delta_H$ value of from 5 to 40.

The invention relates also to the use of such a solid material of formula (A) obtained by a process according to the invention, in which there is prepared a dispersion of said solid material of formula (A) in a liquid medium, called the dispersion liquid, formed of at least one compound having a $\delta_P$ value greater than 8, in particular a $\delta_P$ value of from 8 to 20, and $\delta_H$ value greater than 5, in particular a $\delta_H$ value of from 5 to 40.

Advantageously and according to the invention, said dispersion is applied to a solid surface, especially to an outer surface of an electrode material of a solar cell, in order to form a film of said dispersion of particles having a thickness of from 0.1 µm to 5 µm, especially approximately 2 µm.

Advantageously, there is used a dispersion liquid formed of at least one compound the sum $(\delta_P+\delta_H)$ of which is greater than 22. In particular, the dispersion liquid is formed of a single compound the sum $(\delta_P+\delta_H)$ of which is greater than 22.

Advantageously, a dispersion liquid chosen from the group formed of ethyl alcohol, acetonitrile, ethylene glycol, propylene glycol, dimethyl sulfoxide, dimethylformamide and sulfurous solvents is used.

In such a process for the production of a film for a solar cell, it is possible to carry out a step of densification by sintering of said film under an inert gas atmosphere, of a composition of an inert gas comprising a partial pressure of selenium, or under reduced pressure of an inert gas at a temperature of from 400° C. to 600° C.

The invention extends also to a dispersion of at least one solid material of formula (A) according to the invention in such a dispersion liquid. Advantageously and according to the invention, the dispersion liquid is chosen from the group formed of volatile solvents.

Advantageously, the dispersion of the particles of said solid material of formula (A) in the dispersion liquid has a concentration of said solid material of formula (A) in the dispersion liquid greater than 10 g/l. Such a dispersion of said solid material of formula (A) in the dispersion liquid is a stable dispersion so adapted that more than 70 wt. %, especially more than 80 wt. %, preferably more than 90 wt. %, of the solid material of formula (A) remains in suspension in the dispersion liquid after a period of 2 hours, especially a period of 6 hours, in particular a period of 48 hours, preferably a period of 96 hours, without said dispersion being stirred.

Advantageously, such a dispersion of a solid material of formula (A) in the dispersion liquid is prepared without the addition of any additive, especially organic compound, in particular surface-active compound or polyelectrolyte, capable of modifying the surface tension of the solid material of formula (A) and slowing down the settling of such a material in suspension, or organic binder capable of improving the mechanical strength of the film prior to sintering.

Advantageously, the dispersion liquid is chosen from the group formed of solvents that develop strong polar interactions $(\delta_P)$ and strong hydrogen interactions $(\delta_H)$. These parameters are listed in "*Handbook of solubility parameters and other cohesive parameters,* 1983, CRC press, p. 153-157". Accordingly, there is chosen more particularly at least one solvent from the group formed of ethyl alcohol ($\delta_P$=8.8, $\delta_H$=19.4), acetonitrile ($\delta_P$=18, $\delta_H$=6.1), ethylene glycol ($\delta_P$=11, $\delta_H$=26) and dimethyl sulfoxide ($\delta_P$=16.4, $\delta_H$=10.2), propylene glycol ($\delta_P$=9, $\delta_H$=22), methanol ($\delta_P$=13, $\delta_H$=21) and dimethylformamide ($\delta_P$=14, $\delta_H$=11).

Advantageously, the dispersion liquid is chosen from the group formed of solvents having a boiling temperature at atmospheric pressure below 100° C., especially ethyl alcohol ($CH_3$—$CH_2$—OH) and acetonitrile ($CH_3$—C≡N).

Advantageously and according to the invention, such a dispersion of said solid material of formula (A) in the dispersion liquid is used in the production of a photo-absorbing film of a photovoltaic cell, especially a photo-absorbing film of small thickness, in particular a photo-absorbing film having a thickness substantially of approximately 2 µm.

The invention relates further to a photo-absorbing film of a photovoltaic cell, said film being formed of a solid material of formula (A) according to the invention.

Such a solid material of formula (A), in which the particles are nanometer-sized and have a highly crystalline structure, is adapted to permit the formation of a photo-absorbing film for converting solar energy into electrical energy with increased efficiency as compared with the photoelectric materials of the prior art.

Advantageously and according to the invention, such a composition of particles is used in the production of a photocatalytic film.

The invention relates also to a solid material of formula (A), to a process for the production of such a material, to a dispersion of such a material in a solvent, and to the use of such a dispersion in the production of photovoltaic cells, characterized in combination by all or some of the features mentioned hereinabove or hereinbelow.

Figure 2:
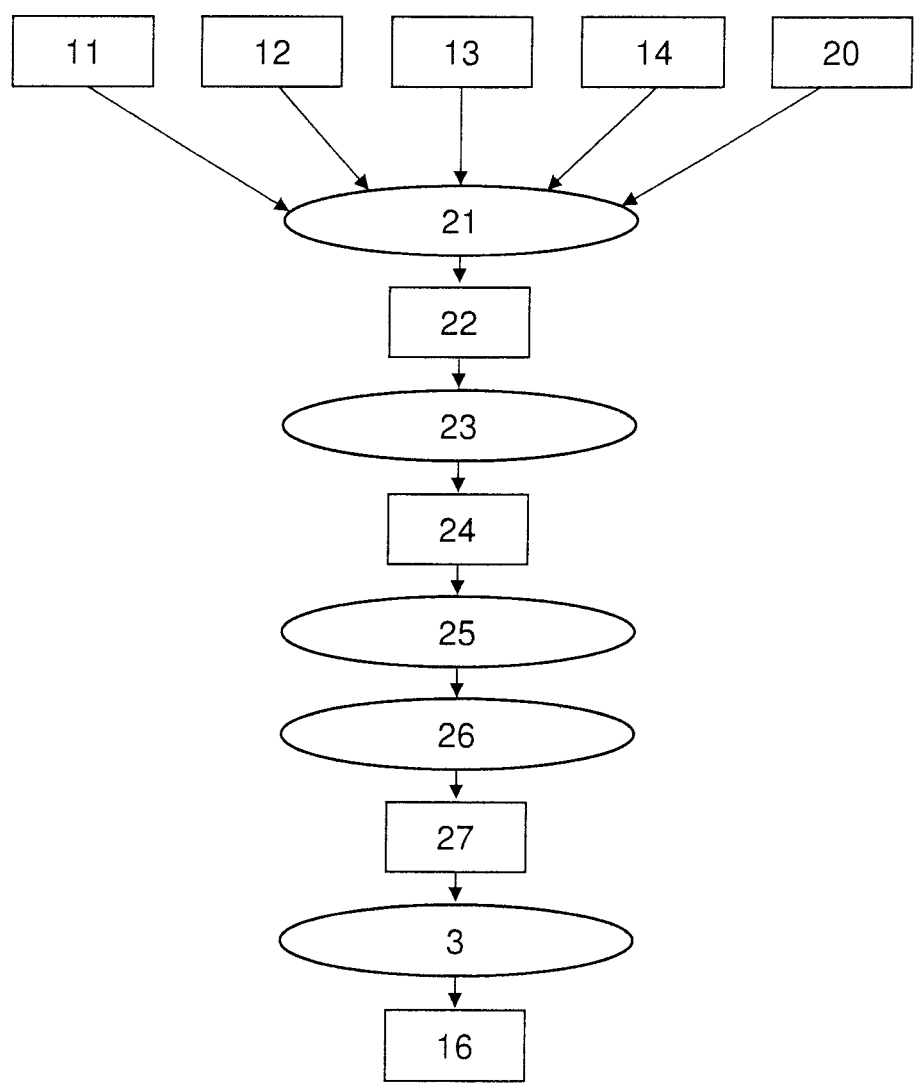
Figure 3:
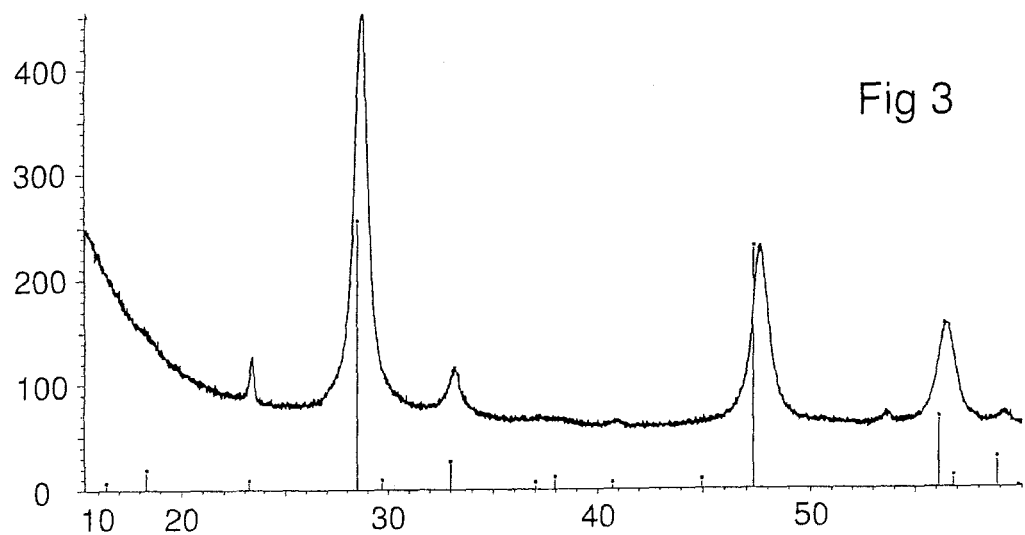
Figure 4:
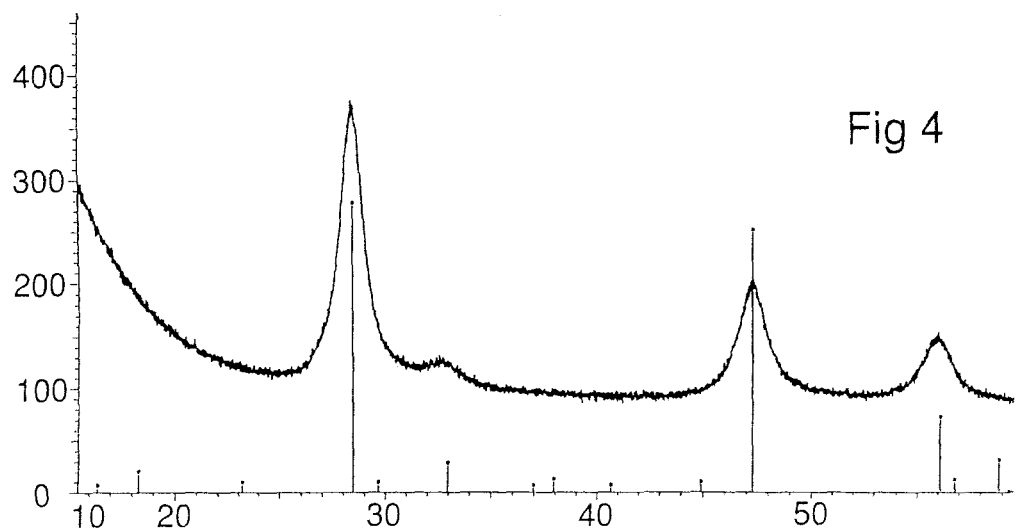
Figure 5:
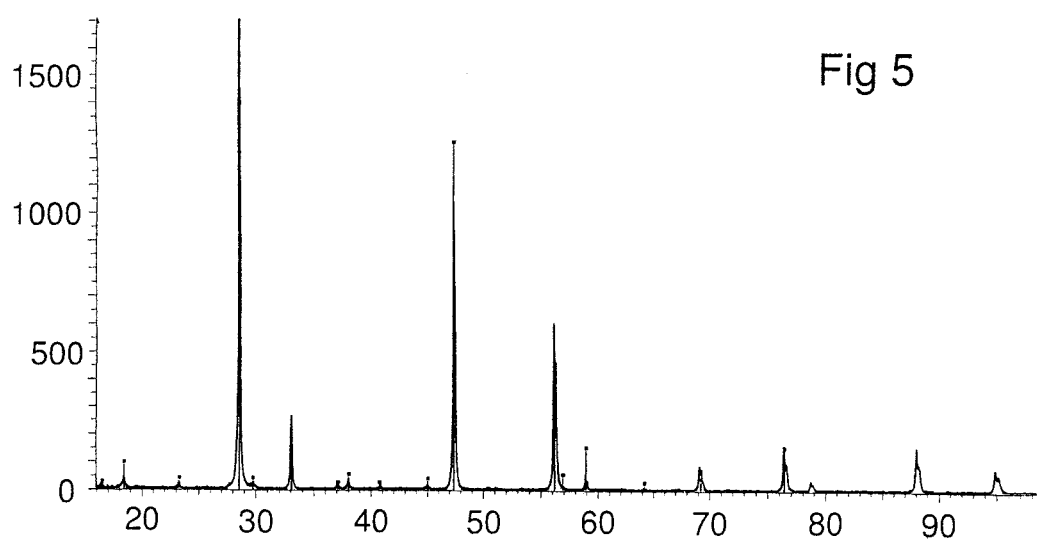
Figure 6:
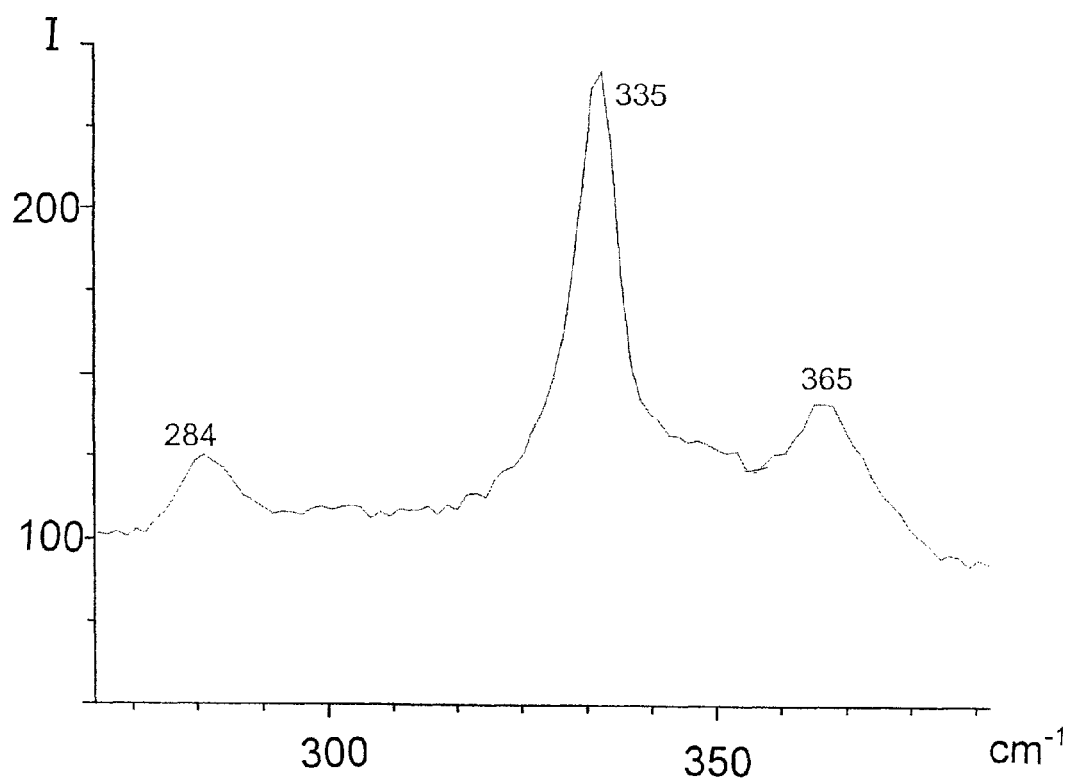

Other objects, features and advantages of the invention will become apparent upon reading the following description, which makes reference to the accompanying figures showing preferred embodiments of the invention, as well as non-limiting examples of processes according to the invention, and in which:

FIG. 1 is a synoptic diagram showing a first variant of a process according to the invention, FIG. 2 is a synoptic diagram showing a second variant of a process according to the invention, FIG. 3 is an X-ray diffractogram of a doped solid material of formula (A) obtained according to Example 2, FIG. 4 is an X-ray diffractogram of a solid material of formula (A) obtained according to Example 4, FIG. 5 is an X-ray diffractogram of a solid material of formula (A) obtained according to Example 7, FIG. 6 is a Raman spectrum of a solid material of formula (A) obtained according to Example 8.

In a process according to the invention shown in FIG. 1, a composition 15 of precursors is prepared during a step 2 of mixing of a precursor 11 of copper, a precursor 12 of tin, a precursor 14 of zinc and a precursor 13 of sulfur. The step 2 of mixing is carried out by suitable means known to the person skilled in the art for permitting the substantially homogeneous mixing of solid precursors in powder form.

In a variant which is not shown, there is added, during the step 2 of mixing, at least one precursor compound of a doping element chosen from the group formed of precursors of cations of silver, gallium, indium, cadmium, titanium, zirconium, lead and selenium.

The composition 15 of solid precursors is placed in a vessel under an atmosphere of an inert gas composition and at ambient temperature. Said vessel is heated, in a molten salt step 3, so that the temperature of the composition 15 of solid precursors in the vessel increases at a rate of increase of the temperature of from 0.5° C./minute to 10° C./minute to a synthesis temperature value, which is maintained for a period of from 2 hours to 36 hours. After natural cooling of the temperature of the vessel to ambient temperature, there is obtained in the vessel a recrystallized material 16 of formula (A) having a single line in X-ray diffraction. The recrystallized material 16 is subjected to a step 4 of removal of the residual precursors, during which the recrystallized material 16 is taken up in water so as to dissolve the excess residual precursors 11, 12, 13, 14, and optionally the by-products formed, while keeping the recrystallized material 16 in solution. The recrystallized material 17 which is substantially free of residual precursors 11, 12, 13, 14 is then recovered by a solid/liquid separation treatment.

The recrystallized material 17 is subjected to a step 5 of grinding by attrition of said recrystallized material 17 adapted to form a solid material 18 of small particle size. After the step 5 of grinding of the crystallized material 17, a treatment 6 of selection of the particles having the smallest particle size is carried out, during which at least one step of differential centrifugation adapted to permit differential sedimentation of the particles of the solid material (1) as a function of their size is carried out.

In a process according to the invention shown in FIG. 2, there is prepared by dissolution 21 a solution 22 of a precursor 11 of copper, a precursor 12 of tin, a precursor 14 of zinc and a precursor 13 of sulfur in a solvent medium 20. This step 21 of dissolution of the precursors 11, 12, 13, 14 in the solvent medium is carried out by means known per se, in particular by magnetic stirring at a temperature close to ambient temperature.

In a variant which is not shown, there is added during the step 21 of dissolution of the precursors at least one precursor compound of a doping element chosen from the group formed of precursors of cations of silver, gallium, indium, cadmium, titanium, zirconium, lead and selenium.

In another variant which is not shown, there is added during the step 21 of dissolution a quantity of at least one reducing compound adapted to permit the reduction of the $Cu^{++}$ and $Cu^{+}$ ions in the solution 22 of precursors.

The solution 22 of precursors is placed in the closed and tight, especially liquid- and gas-tight, vessel of an autoclave which is not stirred and has previously been heated to a temperature of from 140° C. to 250° C. and, during the thermal step 23, the solution 22 of precursors is maintained in that vessel for from 8 hours to 24 hours. After the solution 22 of precursors has returned to ambient temperature, the solid residue 24 that has formed and the liquid supernatant are separated by solid/liquid separation 25, especially by centrifugation. The supernatant separated off by centrifugation is removed, and said solid residue 24 is rinsed with ethyl alcohol at ambient temperature.

The solid residue 24 rinsed with ethyl alcohol is subjected to a grinding treatment 26 adapted to allow the particle size of the solid residue 24 to be reduced. This grinding treatment 26 is carried out using a device known per se to the person skilled in the art, such as a grinder of the attritor type. The solid residue 24 is subjected to such a grinding treatment 26 in which the solid residue 24 in suspension in ethyl alcohol is placed in the presence of beads of a solid material having a particle size of 0.3 mm for a period of time adapted to permit a reduction in the particle size of the solid residue 24 in the ethyl suspension.

The beads of solid material are removed (especially by filtration), yielding a finely divided powder 27, which is subjected to a molten salt step 3 of recrystallization of the particles of the finely divided powder 27. A recrystallized material 16 of formula (A) having a single line in X-ray diffraction and a large mean crystal domain size is obtained. The recrystallized material 16 is subsequently treated as is described in FIG. 1.

In a variant which is not shown, the finely divided powder 27 is subjected to a step of selection of the particles having the smallest particle size, for example by centrifugation adapted to allow the particles having a size greater than 400 nm to be removed by sedimentation and the particles having a size smaller than 400 nm to be maintained in suspension.

EXAMPLE 1

Process for the Production of a Solid Material Based on Cu, Zn, Sn and S from a Powder of Metal Salts in the Form of Chlorides A powder composition comprising 0.674 g of copper(I) chloride (CuCl, PROLABO, France, 6.8 mmoles), 0.465 g of zinc(II) chloride ($ZnCl_2$, ALDRICH, France, 3.41 mmoles), 1.196 g of tin(IV) chloride ($SnCl_4 5H_2O$, ACROS, France, 3.41 mmoles) and 3.308 g of potassium thiocyanate (K—S—C≡N, FLUKA ALDRICH, France, 34 mmoles) is prepared. The powder composition is placed in a mixer so as to form a homogeneous mixture having molar proportions of (Cu, Zn, Sn, S) of (2, 1, 1, 10).

Molten Salt Thermal Treatment

The powder composition is transferred to an alumina crucible, which is placed in the vessel of a reactor adapted to permit renewal of its atmosphere. Said reactor is placed in a vertical tubular furnace. The atmosphere of the reactor is purged with gaseous nitrogen ($N_2$). The crucible is heated, by means of the furnace, in order to increase the temperature of the vessel from ambient temperature to 400° C. in 6 hours. The temperature of 400° C. is maintained in the vessel of the reactor for 24 hours, still under a stream of gaseous nitrogen, and then the crucible is allowed to cool naturally to ambient temperature. An aerated solid material of increased apparent volume relative to the initial powder composition is obtained.

Extraction of the Solid Material

The aerated solid material is taken up in a volume of 200 ml of water. The resulting aqueous suspension is incubated for one hour, with stirring, in order to dissolve the residual salts and the excess thiocyanate in the water. A black-colored solid material is obtained and is separated from the aqueous phase by sedimentation, especially by centrifugation at 1720 g for 20 minutes. The black-colored solid material is washed again with 200 ml of a solution of ethyl alcohol, and the resulting solid material is dried in the air and at ambient temperature.

Grinding of the Solid Material 10 g of the dry solid material as obtained above, 27 g of grinding beads formed of crystalline alumina ($Al_2O_3$) having a particle size of approximately 0.4 mm, and 20 ml of ethyl alcohol are placed in the receptacle (of useful dimensions 40 mm×85 mm) of an attrition mill The preparation is subjected to treatment by grinding for one hour at ambient temperature. The grinding beads and the solid material in suspension in the ethyl alcohol are separated by filtration. Said suspension of the solid material is subjected to a step of centrifugation at 1720 g for 20 minutes at ambient temperature. There are obtained a deposit (C1), containing the solid material, and a liquid supernatant, which is removed. The grinding beads previously recovered are washed with 600 ml of ethyl alcohol to form a washing suspension, and the washing suspension is added to the deposit (C1) to form a secondary suspension of the solid material in ethyl alcohol. The step of washing the grinding beads is repeated, and the bead washing suspensions are added to the deposit (C1).

This suspension of the solid material in ethanol is treated with ultrasound, and centrifugation is carried out at a speed of 1720 g for 20 minutes at ambient temperature, during which the particles forming the solid material settle. The centrifugation supernatant is removed, and the settled solid material is dispersed in one volume of acetonitrile ($CH_3-C\equiv N$, ALDRICH, France). The suspension of the solid material in acetonitrile is centrifuged at 500 g for 20 minutes at ambient temperature. There are obtained a precipitate and a black-colored suspension containing the solid material according to the invention in acetonitrile.

Analyses

Analysis of the solid material by transmission electron microscopy shows individualized particles, the mean apparent diameter of which is approximately 0.2 μm.

The X-ray diffraction spectrum of the solid material obtained after drying of the suspension in acetonitrile is characteristic of a single ($Cu_2ZnSnS_4$) structure. Analysis of the spectrum by the Debye-Scherrer method shows organized crystal domains, the mean apparent size of which is approximately 12 nm.

EXAMPLE 2

Process for the Production of a Doped Solid Material Based on Cu, Zn, Sn, Ga, S from a Solution of Metal Salts in the Form of Chlorides 0.348 g of zinc(II) chloride ($ZnCl_2$, ALDRICH, France, 2.55 mmoles), 0.894 g of tin(IV) chloride ($SnCl_4\cdot 5H_2O$, ACROS, France, 2.55 mmoles) and 0.672 g of copper(I) chloride (CuCl, PROLABO, France, 6.8 mmoles) are added to a solution of gallium(III) chloride ($GaCl_3$, ALDRICH, France) in 46.1 ml of ethyl alcohol (0.119 g of $GaCl_3$, 1.705 mmoles). The saline species are dissolved in the ethyl alcohol by magnetic stirring and treatment with ultrasound. The ethyl alcohol is removed from the solution by evaporation under reduced pressure at 80° C. 4.95 g of potassium thiocyanate ($K-S-C\equiv N$, 51 mmoles) are added to the pasty solid obtained after evaporation of the ethyl alcohol. The molar proportions (Cu, Zn, Sn, Ga, S) in the mixture are (2, 0.75, 0.75, 0.5, 15).

The melting, extraction and grinding steps are carried out according to the embodiment described in Example 1.

Analyses

Analysis of this solid material by transmission electron microscopy shows individualized particles, the mean apparent diameter of which is approximately 0.2 μm and which have primary crystallites approximately 25 nm in size. The X-ray diffraction spectrum (FIG. 3) of the powder obtained after drying of the suspension of the solid material is characteristic of a single crystal structure in which the lines are offset towards high values of 2 theta. Analysis by modelling according to the Debye-Scherrer method shows organized crystal domains, the mean apparent size of which is approximately 16 nm. The Raman scattering spectrum shows a broad line centred at 330 $cm^{-1}$, the width at half-height of which is 50 $cm^{-1}$.

Furthermore, analysis by NIR-UV-VIS of a dispersion prepared in acetonitrile shows a forbidden band width value of 2.23 eV.

EXAMPLE 3

Production of a Doped Solid Material Based on Cu, Zn, Cd, Sn, S from a Powder of Metal Salts in the Form of Chlorides A powder composition comprising 0.683 g of copper(I) chloride (CuCl, 6.9 mmoles), 0.352 g of zinc(II) chloride ($ZnCl_2$, 2.58 mmoles), 1.212 g of tin(IV) chloride ($SnCl_4\cdot 5H_2O$, 3.46 mmoles), 0.189 g of cadmium(II) chloride ($CdCl_2\cdot 2H_2O$, 0.86 mmole) and 6.724 g of potassium thiocyanate ($K-S-C\equiv N$, 70 mmoles) is prepared. The powder composition is homogenized by methods known per se. A mixture of (Cu, Zn, Cd, Sn, S) in molar proportions of (2, 0.75, 0.25, 1, 20) is obtained.

Molten Salt Thermal Treatment

The molten salt thermal treatment is carried out according to Example 1, but the synthesis temperature is 450° C. The steps of extraction and grinding are carried out according to the embodiment described in Example 1.

Analyses

Analysis of the solid material by transmission electron microscopy shows individualized particles, the mean apparent diameter of which is approximately 0.2 μm and which have primary crystallites, the mean equivalent diameter of which is approximately 30 nm The X-ray diffraction spectrum of the solid material obtained after drying is characteristic of a single crystal structure in which the lines are offset towards low values of 2 theta.

EXAMPLE 4

Preparation of a Solid Material According to the Invention Based on Cu, Zn, Sn, S by Solvothermal Treatment of an Ethanolic Solution of Metal Precursors in the Form of Chlorides 1.577 g of tin(IV) chloride hydrate ($SnCl_4 5H_2O$, 4.5 mmoles), 0.614 g of zinc(II) chloride ($ZnCl_2$, 4.5 mmoles) and 1.534 g of copper(II) chloride ($CuCl_2\cdot 2H_2O$, 9 mmoles) are introduced into 200 ml of absolute ethyl alcohol. The suspension of metal salts so formed is stirred until said metal salts have dissolved completely in the absolute ethyl alcohol. 2.054 g of thiourea ($CS(NH_2)_2$, FLUKA ALDRICH, France, 27 mmoles) are then added to the solution of Sn(IV), Cu(II) and Zn(II) and said solution is stirred for 10 minutes at ambient temperature. 1.584 g of ascorbic acid ($C_6H_8O_6$, ALDRICH, France, 9 mmoles) are then added, with stirring and at ambient temperature, the volume of the solution is made up to 240 ml with absolute ethyl alcohol, and the mixture is stirred for a further 20 minutes.

The mixture is placed in a Teflon crucible and disposed in an autoclave (Parr flask) at a temperature of 200° C. for 16 hours. The autoclave is then cooled by natural thermal decline to room temperature. A precipitate is obtained and is separated from the ethyl alcohol by centrifugation at 1720 g for 20 minutes at ambient temperature. The precipitate is washed twice with 240 ml of ethyl alcohol, and the precipitate is recovered by centrifugation. After drying at ambient temperature for 48 hours, the precipitate is weighed (m=1.4 g).

Grinding of the Solid Material

The precipitate obtained above, 27 g of grinding beads formed of crystalline alumina ($Al_2O_3$) having a particle size of approximately 0.3 mm, and 15 ml of ethyl alcohol are placed in the receptacle (of useful dimensions 40 mm×85 mm) of an attrition mill The preparation is subjected to a grinding treatment for one hour at ambient temperature, adapted to permit the formation of a solid material in suspension in the ethyl alcohol. The grinding beads and the suspension of said solid material are separated by filtration. The grinding beads are washed with ethyl alcohol, during which the suspension is treated alternately with ultrasound and by magnetic stiffing. The suspensions containing the solid material obtained by successive washings of the grinding beads are combined to form a suspension of the solid material having a volume of approximately 600 ml.

The suspension is centrifuged at 2080 g for 20 minutes and the deposit and the colored (brown/black) supernatant so obtained are separated. The deposit is taken up in 1500 ml of ethyl alcohol, and the suspension is treated alternately with ultrasound and by magnetic stirring and centrifuged at 1720 g for 10 minutes. The supernatant is removed and mixed with the colored supernatant to form a suspension of the solid material according to the invention.

Analyses

Analysis of an aliquot fraction of the suspension by transmission electron microscopy shows individualized objects having a mean equivalent diameter substantially of approximately 150 nm and which are in the form of aggregates of elementary crystals having a mean equivalent diameter of approximately 10 nm.

The suspension of particles is dried by evaporating off the ethyl alcohol to form a powder, the mass of which is 1.1 g. The X-ray diffraction spectrum (FIG. 4) of the powder shows a single ($Cu_2$; $Zn$; $Sn$; $S_4$) structure. The size of the organized domains determined by the Debye-Scherrer method shows organized crystal domains, the mean apparent diameter of which is approximately 10 nm.

EXAMPLE 5

Production of a Solid Material According to the Invention Based on Cu, Zn, Sn, S According to the Invention by Treatment of a Powder of Polycrystalline Particles 0.5 g of the powder of particles ($Cu_2$; $Zn$; $Sn$; $S_4$) obtained at the end of the process described in Example 4 is mixed with 1.66 g of potassium thiocyanate. The molar proportion (S)/(Cu) in the mixture is 7.5. The mixture, placed in an alumina crucible, is introduced into a vessel under a nitrogen atmosphere at ambient temperature. The vessel is heated so that its temperature increases steadily and reaches 400° C. in 150 minutes, and the temperature of 400° C. is then maintained in the vessel for 16 hours. After natural cooling of the vessel, the calcined powder is taken up in 200 ml of demineralized water and the suspension is homogenized by magnetic stirring for 30 minutes so that the residual thiocyanate dissolves in the water. The suspension so obtained is centrifuged at 1700 g for 20 minutes, and the resulting solid is washed with 200 ml of ethyl alcohol. After centrifugation at 1720 g for 20 minutes and removal of the ethanolic supernatant, the solid is dried at ambient temperature.

Analyses

The X-ray diffraction spectrum of the powder obtained after drying of the particle composition shows a single ($Cu_2ZnSnS_4$) structure. Analysis by modelling according to the Debye-Scherrer method shows organized crystal domains, the mean apparent size of which is approximately 60 nm.

Grinding of the particles is carried out as described above in Example 1, and the particles are selected by centrifugation at 1720 g for 10 minutes. The supernatant is collected and dried to form a powder of solid particles.

Analysis of the powder of solid particles by transmission electron microscopy shows a composition of individualized submicron particles, the mean apparent diameter of which is approximately 150 nm.

Analysis of the spectral data obtained by near-infrared absorption spectroscopy indicates a forbidden band width of 1.3 eV.

EXAMPLE 6

Production of a Solid Material According to the Invention Based on Cu, Zn, Sn, S According to the Invention by Solvothermal Treatment in Ethylene Glycol and Molten Salt Treatment 2.555 g of copper(II) chloride ($CuCl_2$-$2H_2O$; 15 mmoles), 1.020 g of zinc(II) chloride ($ZnCl_2$; 7.5 mmoles), 2.625 g of tin(IV) chloride hydrate ($SnCl_45H_2O$; 7.5 mmoles) are introduced into 300 ml of ethylene glycol. The suspension of the metal salts so formed is stirred for 10 minutes until said metal salts have dissolved completely in the ethylene glycol. 5.705 g of thiourea ($CS(NH_2)_2$; 75 mmoles) are then added to the solution of Sn(IV), Cu(II) and Zn(II), and said solution is stirred for 20 minutes at ambient temperature. 6.075 ml of a solution of TMaOH in methanol (TMaOH; 15 mmoles) are then added, with stirring and at ambient temperature. The mixture is stirred for a further 20 minutes. The molar proportions (Cu; Zn; Sn; S; OH) in the composition are (2; 1; 1; 10; 2).

The mixture is placed in a Teflon crucible disposed in an autoclave (Parr flask) at a temperature of 200° C. for 16 hours. The autoclave is then cooled by natural thermal decline to ambient temperature. A precipitate is obtained and is separated from the ethylene glycol by centrifugation at 1720 g for 20 minutes at ambient temperature. The precipitate is washed three times with 300 ml of water and then once with 300 ml of ethyl alcohol. The precipitate is recovered by centrifugation then drying at ambient temperature for 48 hours.

Grinding of the Solid Material in Ethyl Alcohol

Grinding is carried out as described in Example 4. After removal of the grinding beads, the grinding suspension is taken up in 600 ml of ethyl alcohol. The ethyl phase is removed by drawing off, and the resulting precipitate is washed three times with 250 ml of ethyl alcohol. The ethyl suspension so obtained is centrifuged at 500 g for 10 minutes in order to remove by sedimentation the particles having the largest diameter. The fine particles according to the invention are collected in the supernatant.

Analyses

Analysis of an aliquot fraction of the suspension by transmission electron microscopy shows individualized objects which have a mean equivalent diameter substantially of approximately 200 nm and which are in the form of elementary crystals having a mean equivalent diameter of approximately 10 nm.

The suspension of particles is dried by evaporation of the ethyl alcohol in order to form a finely divided powder, the X-ray diffraction spectrum of which shows organized domains, the mean apparent diameter of which is approximately 10 nm.

EXAMPLE 7

Production of a Solid Material According to the Invention Based on Cu, Zn, Sn, S 0.4 g of the powder ($Cu_2$; Zn; Sn; $S_4$) obtained at the end of the process described in Example 6 is mixed with 1.3 g of potassium thiocyanate. The molar proportion (S)/(Cu) in the mixture is 7. The mixture, placed in an alumina crucible, is introduced into a vessel under a nitrogen atmosphere at ambient temperature. The vessel is heated so that its temperature increases steadily and reaches 400° C. in 150 minutes, and the temperature of 400° C. is then maintained in the vessel for 16 hours. After natural cooling of the vessel, the calcined powder is taken up in 300 ml of demineralized water and the suspension is homogenized by magnetic stiffing for 30 minutes in order to dissolve the residual thiocyanate in the water. The suspension so obtained is centrifuged at 1700 g for 20 minutes, and the solid obtained is washed with 300 ml of ethyl alcohol. After centrifugation at 1720 g for 20 minutes and removal of the ethanolic supernatant, the solid is dried at ambient temperature.

Analyses

The X-ray diffraction spectrum of the powder (FIG. 5) obtained after drying of the composition of particles shows a single ($Cu_2ZnSnS_4$) structure. Analysis by modelling according to the Debye-Scherrer method shows organized crystal domains, the mean apparent size of which is approximately 60 nm.

Grinding of the particles is carried out as described above in Example 1, and the particles are selected by centrifugation at 1720 g for 10 minutes. The supernatant is collected and dried to form a powder of solid particles.

Analysis of the powder of solid particles by transmission electron microscopy shows a composition of individualized and crystallized submicron particles, the mean apparent diameter of which is approximately 200 nm.

Analysis of the spectral data obtained by near-infrared absorption spectroscopy indicates a forbidden band width of 0.9 eV.

EXAMPLE 8

Production of a Solid Material According to the Invention Based on Cu, Zn, Sn, S According to the Invention by Solvothermal Treatment in Ethylene Glycol Starting from Metal Chloride Salts and Then Molten Salt Treatment 1.73 g of tin(IV) chloride hydrate ($SnCl_45H_2O$, i.e. 4.95 mmoles), 0.8 g of zinc(II) chloride ($ZnCl_2$, 5.85 mmoles) and 1.534 g of copper(II) chloride ($CuCl_2-2H_2O$, 9 mmoles) are introduced into 200 ml of ethylene glycol. The suspension of the metal salts so formed is stirred at ambient temperature until said metal salts have dissolved completely in the ethylene glycol. 3.42 g of thiourea $CS(NH_2)_2$ (FLUKA ALDRICH, France, 45 mmoles) are then added to the solution of Sn(IV), Cu(II) and Zn(II), and said solution is stirred for 10 minutes at ambient temperature. 3.645 ml of a 25% solution of tetramethylammonium hydroxide (TMaOH) (i.e. 9 mM) in methanol MeOH are then added, with stirring and at ambient temperature, and stirring is continued for 30 minutes. The solution is made up to 300 ml with ethylene glycol, and the mixture is stirred for a further 20 minutes. The molar proportions (Cu; Zn; Sn; S; OH) in the solution are (2; 1.3; 1.1; 10; 2).

The mixture is placed in a Teflon crucible, which is disposed in an autoclave (Parr flask) which is not stirred and is placed in a vessel at a temperature of 200° C. for 16 hours. The autoclave is then cooled by natural thermal decline to ambient temperature.

A precipitate is obtained and is separated from the liquid solution of the mother liquors by centrifugation at 1720 g for 20 minutes at ambient temperature. The precipitate is washed with 300 ml of water, and the precipitate is recovered by centrifugation at 1720 g for 20 minutes at ambient temperature. This operation of washing the precipitate with water is repeated three times. The precipitate is rinsed in ethyl alcohol and recovered by centrifugation.

The synthesis described above in Example 8 is repeated once in an identical manner, and the two precipitates obtained are collected. After drying at ambient temperature for 48 hours, the precipitate is weighed (m=4 g).

Grinding of the Solid Material

The precipitate obtained above (4 g), 32 g of grinding beads (particle size approximately 0.3 mm) formed of $ZrO_2$—$Y_2O_3$, and 10 ml of ethyl alcohol are placed in the receptacle of an attrition mill. The preparation is subjected to a grinding treatment for 4 hours at ambient temperature. 10 ml of ethyl alcohol are added, and grinding is continued for a further 4 hours. The suspension of the ground solid is stirred for 12 hours in the presence of the grinding beads, and then the grinding beads and the suspension of said solid material are separated by filtration.

The grinding beads are washed several times with ethyl alcohol, and the grinding beads and the washing suspensions of the solid material are separated by filtration. The suspensions containing the solid material obtained by successive washings of the grinding beads are combined to form a suspension of the solid material in ethyl alcohol.

Centrifugation of the suspension is carried out at 2080 g for 20 minutes, during which there are separated a crude solid deposit comprising the solid material, and a liquid supernatant, which is removed.

The resulting crude solid deposit is taken up and suspended in 600 ml of ethyl alcohol, and the suspension is treated alternately with ultrasound and with magnetic stirring and centrifuged at 1470 g for 10 minutes. There are obtained a residual deposit and a colored (brown/black) supernatant formed of a suspension of the solid material according to the invention in ethyl alcohol. The operation of washing the residual deposit is repeated twice in succession.

The three suspensions of the solid material (total volume 1800 ml) in ethyl alcohol are mixed. The concentration of the solid material in the divided state $Cu_2ZnSnS_4$ in the suspension is 0.8 g/l. The suspension is stable to settlement for more than 4 days when stored in sealed bottles.

An analysis of the suspension by transmission electron microscopy is carried out after treatment of said suspension with ultrasound, deposition and drying on a membrane, during which individualized nanoparticles having a size of approximately 180 nm in the form of aggregates are visualized. The aggregates are constituted by primary crystallites having a size of approximately 7 nm.

Analysis of the nanoparticles of the suspension by X-ray diffraction shows a set of lines attributable to the $Cu_2ZnSnS_4$ structure.

The particles of the solid material dispersed in a resin are analyzed by energy-dispersive spectroscopy under a scanning electron microscope (×2000 magnification) (EDS-MEB) over 5 statistically representative observation fields. The measured molar ratios Zn/Cu=1 and Sn/Cu=1 demonstrate the stoichiometric composition of the material.

Molten Salt Thermal Treatment 0.5 g of the powder of particles ($Cu_2$; Zn; Sn; $S_4$) obtained above is mixed with 1.66 g of KSCN. The molar proportion (S)/(Cu) in the mixture is 7.5. The mixture, placed in an alumina crucible, is introduced into a vessel under a nitrogen atmosphere at ambient temperature. The vessel is heated so that its temperature increases steadily and reaches 500° C. in 150 minutes, and the temperature of 500° C. is then maintained in the vessel for 6 hours. After natural cooling of the vessel, the calcined powder is taken up in 200 ml of demineralized water and the suspension is homogenized by magnetic stiffing for 30 minutes so that the residual KSCN dissolves in the water. The suspension so obtained is centrifuged at 1700 g for 20 minutes, the supernatant is removed, and the resulting solid is taken up in 200 ml of demineralized water by homogenization for 20 minutes. A suspension (S1) is formed.

The suspension (S1) obtained is centrifuged at 1720 g for 20 minutes in order to form a solid deposit (C1) and a colored dispersion (D1), which is subjected to centrifugation at 8000 g for 20 minutes. The deposit (C2) from centrifugation at 8000 g is dispersed in 20 ml of ethyl alcohol to form a dispersion (D1) of the solid material according to the invention in ethyl alcohol.

The solid deposit (C1) is taken up and dispersed in 200 ml of ethyl alcohol by magnetic stirring for 20 minutes to form a suspension (S2). By centrifugation of the suspension (S2) at 1720 g for 20 minutes there is formed a colored dispersion (D2), which is subjected to a step of centrifugation at 8000 g for 20 minutes. The deposit (C3) from centrifugation at 8000 g is dispersed in 20 ml of ethyl alcohol to form a dispersion (D3) of the solid material according to the invention in ethyl alcohol. The dispersions (D2) and (D3) are mixed. The particles of the solid material obtained form a dispersion which is stable over several days in ethyl alcohol.

Analysis of (D2) and (D3) by transmission electron microscopy shows perfectly individualized particles which have a size of approximately 100 nm and have a plate- and/or cube-type morphology.

Analysis by X-ray diffraction of dispersions (D2) and (D3) after drying shows lines attributable to $Cu_2ZnSnS_4$.

The Raman spectrum of the particles of dispersions (D2) and (D3) shown in FIG. 6 exhibits, in the region 200-400 $cm^{-1}$, a principal line centred at 335 $cm^{-1}$ and secondary lines centred at 365 and 284 $cm^{-1}$.

EXAMPLE 9

Production of a Solid Material According to the Invention Based on Cu, Zn, Sn, S According to the Invention by Solvothermal Treatment in Isopropanol Starting from Metal Chloride Salts and Molten Salt Treatment 1.534 g of copper(II) chloride ($CuCl_2$-$2H_2O$, 9 mmoles), 1.577 g of tin(IV) chloride hydrate ($SnCl_4 5H_2O$, i.e. 6.75 mmoles) and 0.922 g of zinc(II) chloride ($ZnCl_2$, 5.85 mmoles) are introduced into 200 ml of absolute isopropanol. The mixture of the metal salts in isopropanol is stirred at ambient temperature for approximately 20 minutes and until said salts have dissolved in the isopropanol. 4.793 g of thiourea $CS(NH_2)_2$ (FLUKA ALDRICH, France, 63 mmoles) are then added to the solution of Sn(IV), Cu(II) and Zn(II), and said solution is stirred for 10 minutes at ambient temperature. 7.29 ml of a 25% solution of tetramethylammonium hydroxide (TMaOH) (i.e. 18 mM) in methanol are then added, with stirring and at ambient temperature, and stirring is continued for 30 minutes.

1.584 g of ascorbic acid ($C_6H_8O_6$, ALDRICH, France, 9 mmoles) are added to the solution. The solution is made up to 240 ml with absolute isopropanol, and the mixture is stirred for a further 20 minutes. The molar proportions (Cu; Zn; Sn; S; OH; ascorbic ac.) in the solution are (2; 1.5; 1; 14; 4; 2).

The solution is treated in an autoclave as described in Example 8. The autoclave is then cooled by natural thermal decline to ambient temperature.

A precipitate is obtained and is separated from the liquid solution of the mother liquors by centrifugation at 1720 g for 20 minutes at ambient temperature. The precipitate is washed with 240 ml of water, and the precipitate is recovered by centrifugation at 1720 g for 20 minutes at ambient temperature. This operation of washing the precipitate with water is repeated three times. The precipitate is rinsed in ethyl alcohol and recovered by centrifugation.

The synthesis described above in Example 8 is repeated once in an identical manner, and the two precipitates obtained are collected. After drying at ambient temperature for 48 hours, the precipitate is weighed (m=4 g).

The step of grinding the solid material is carried out according to the grinding process described in Example 8. The concentration of the solid material in the divided state $Cu_2ZnSnS_4$ in the final suspension is 0.8 g/l. The suspension is stable to settlement for more than 4 days when stored in sealed bottles.

Analysis of the suspension by transmission electron microscopy after treatment of said suspension with ultrasound, deposition and drying on a membrane shows individualized nanoparticles having a size of approximately 150 nm in the form of aggregates. The aggregates are constituted by primary crystallites having a size of approximately 6 nm. Analysis of the nanoparticles of the suspension by X-ray diffraction shows a set of lines attributable to the $Cu_2ZnSnS_4$ structure.

Analysis of the nanoparticles by energy-dispersive spectroscopy under a scanning electron microscope (×2000 magnification) (EDS-MEB) over 5 statistically representative fields of observation shows that the molar ratio Zn/Cu=0.85 and Sn/Cu=1.13.

Molten Salt Thermal Treatment 0.5 g of the powder of particles ($Cu_2$; Zn; Sn; $S_4$) obtained above is mixed with 2.49 g of solid KSCN. The molar proportion (S)/(Cu) in the mixture is 11.25. The mixture, placed in an alumina crucible, is introduced into a vessel under a nitrogen atmosphere at ambient temperature. The vessel is heated so that its temperature increases steadily and reaches 450° C. in 150 minutes, and the temperature of 450° C. is then maintained in the vessel for 6 hours. After natural cooling of the vessel, the procedure according to the process described in Example 8 is followed.

Analysis of (D2) and (D3) by transmission electron microscopy shows perfectly individualized particles which have a size of approximately 150 nm and have a plate- and/or cube-type morphology.

Analysis by X-ray diffraction of dispersions (D2) and (D3) after drying shows lines attributable to $Cu_2ZnSnS_4$. The particles of the solid material obtained form a dispersion which is stable for several days in ethyl alcohol.

The invention claimed is:

1. A solid material of formula (A):

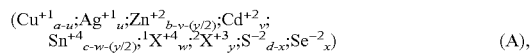

(A), wherein:

a, b, c, d, u, v, w, x and y and their arithmetic combinations are real numbers which represent the atomic fraction of each element with which each number is associated in formula (A), and are such that:

1.6<a<2.4;
0.6<b<1.2;
0.6<c<1.2;
3.5<d<4.5; and u, v, w, x and y, independently of one another, belong to the set of real numbers in the interval [0; 0.5], $^1X^{+4}$ is selected from the group consisting of the cations of titanium (Ti), the cations of zirconium (Zr) and the cations of lead (Pb), $^2X^{+3}$ is selected from the group consisting of the cations of gallium (Ga), the cations of indium (In) and the cations of yttrium (Y);

and wherein, said solid material:

is in a divided state in the form of particles having a mean equivalent diameter of from 15 nm to 400 nm;

exhibits, by analysis of said solid material by X-ray diffraction, single crystal structure; and forms a stable dispersion of at least one solid material of formula (A) in any liquid, called the dispersion liquid, formed of at least one compound having a $\delta_p$ value greater than 8 and a $\delta_H$ value greater than 5.

2. The material as claimed in claim 1, wherein the dispersion liquid is selected from the group consisting of ethyl alcohol, acetonitrile, ethylene glycol, dimethyl sulfoxide, propylene glycol, methanol and dimethylformamide.

3. The material as claimed in claim 2, wherein the material has, in absorption spectroscopy, a forbidden band width of from 0.9 eV to 2.8 eV.

4. The material as claimed in claim 1, wherein the material has, in absorption spectroscopy, a forbidden band width of from 0.9 eV to 2.8 eV.

5. The material as claimed in claim 1, wherein the particles constituting the solid material have at least one domain, called the crystal domain, having a mean size, measured by X-ray diffraction, of from 4 nm to 100 nm, said crystal domain having a single crystal structure.

6. The material as claimed in claim 1, wherein the material is formed of polycrystalline particles.

7. The material as claimed in claim 1, wherein the particles constituting the solid material of formula (A) are monocrystalline particles.

8. The material as claimed in claim 7, wherein the material has, by Raman spectroscopy, a scattering line, called the primary line, which has a maximum scattering intensity at a wave number value of from 330 $cm^{-1}$ to 340 $cm^{-1}$.

9. The material as claimed in claim 8, wherein said primary line has a line width at half-height of from 5 $cm^{-1}$ to 18 $cm^{-1}$.

10. The material as claimed in claim 1, wherein the material has, by Raman spectroscopy, a scattering line, called the primary line, which has a maximum scattering intensity at a wave number value of from 310 $cm^{-1}$ to 340 $cm^{-1}$.

11. The material as claimed in claim 10, wherein the primary line has a line width at half-height of from 5 $cm^{-1}$ to 60 $cm^{-1}$.

12. The material as claimed in claim 1, wherein the material has, by Raman spectroscopy, a secondary scattering line which has a maximum scattering intensity at a wave number value of from 260 $cm^{-1}$ to 285 $cm^{+1}$.

13. A process for obtaining the solid material of formula (A) according to claim 1, comprising the following steps:

(a) selecting at least one precursor compound of each element constituting the solid material of formula (A);

(b) preparing a solid composition, called the composition of precursors, by mixing the precursor(s) of each element constituting the solid material of formula (A);

(c) placing the composition of precursors in a vessel under an inert gas atmosphere at a temperature of approximately ambient temperature;

(d) heating the composition of precursors during a step, called the molten salt step, at a rate of temperature increase from 0.5° C./minute to 10.0° C./minute, and which is adapted so that the temperature of the vessel reaches a synthesis temperature of from 250° C. to 500° C., and maintaining said synthesis temperature for a period, called the synthesis period, of from 2 hours to 36 hours, so as to form a recrystallized material having a single structure by X-ray diffraction;

(e) after cooling of the recrystallized material, separating a solid material that is free of precursors;

(f) reducing the particle size of the solid material free of precursors; and (g) selecting the particles of the material whose particle size has been so reduced to retain the particles having the smallest particle size.

14. The process as claimed in claim 13, wherein:

the respective molar proportions (a', u', b', v', c', y' and w') of the elements Cu, Ag, Zn, Cd, Sn, $^1X$ and $^2X$ constituting the composition of precursors are in the respective stoichiometric proportions a, u, b, v, c, y and w of the solid material of formula (A), the respective molar proportions (d' and x') of the elements S and Se constituting the composition of precursors are such that the sum (d'+x') is from 5 to 30, and said values (a', u', b', v', c', y', d' and x') are adapted to satisfy the condition of electroneutrality of the solid material.

15. The process as claimed in claim 14, wherein:

the precursor(s) of copper (Cu) is selected from the group consisting of copper(I) chloride (CuCl), copper(II) chloride dihydrate ($CuCl_2$ $2H_2O$), copper nitrate (Cu(NO$_3$)$_2$), copper acetate ((CH$_3$COO)$_2$Cu), freshly prepared Cu hydroxides and freshly prepared Cu (oxy)hydroxides;

the precursor(s) of tin (Sn) is/are selected from the group consisting of stannic chloride pentahydrate (SnCl$_4$ 5H$_2$O), stannic acetate ((CH$_3$COO)$_4$SN), freshly prepared Sn$^{+4}$ hydroxides and freshly prepared Sn$^{+4}$ (oxy)hydroxides;

the precursor(s) of zinc (Zn) is/are selected from the group consisting of zinc chloride (ZnCl$_2$), zinc acetate ((CH$_3$COO)$_2$Zn), freshly prepared Zn$^{+2}$ hydroxides and freshly prepared Zn$^{+2}$ (oxy)hydroxides;

the precursor(s) of anion(s) is/are selected from the group consisting of potassium thiocyanate (K—S—C≡N), thiourea (S═C(NH$_2$)$_2$), sodium sulfide hydrate (Na$_2$S, 9H$_2$O), sodium sulfide (Na$_2$S) potassium selenocyanate (K—Se—C≡N) and selenourea (Se═C(NH$_2$)$_2$); and the precursor(s) of doping agent(s) is/are selected from the group consisting of silver nitrate (AgNO$_3$), gallium chloride (GaCl$_3$), cadmium chloride (CdCl$_2$), gallium nitrate (Ga(NO$_3$)$_3$), cadmium nitrate (Cd(NO$_3$)$_3$), cadmium iodide (CdI$_2$) and lead acetate ((CH$_3$COO)$_4$Pb), yttrium nitrate (Y(NO$_3$)$_3$), gallium (oxy)hydroxides, lead (oxy)hydroxides and yttrium (oxy)hydroxides.

16. The process as claimed in claim 12, wherein:

the precursor(s) of copper (Cu) is/are selected from the group consisting of copper(I) chloride (CuCl), copper (II) chloride dihydrate (CuCl$_2$ 2H$_2$O), copper nitrate (Cu(NO$_3$)$_2$), copper acetate ((CH$_3$COO)$_2$Cu), freshly prepared Cu hydroxides and freshly prepared Cu (oxy)hydroxides;

the precursor(s) of tin (Sn) is/are selected from the group consisting of stannic chloride pentahydrate (SnCl$_4$ 5H$_2$O), stannic acetate ((CH$_3$COO)$_4$Sn), freshly prepared Sn$^{+4}$ hydroxides and freshly prepared Sn$^{+4}$ (oxy)hydroxides;

the precursor(s) of zinc (Zn) is/are selected from the group consisting of zinc chloride (ZnCl$_2$), zinc acetate ((CH$_3$COO)$_2$Zn), freshly prepared Zn$^{+2}$ hydroxides and freshly prepared Zn$^{+2}$ (oxy)hydroxides;

the precursor(s) of anion(s) is/are selected from the group consisting of potassium thiocyanate (K—S—C≡N), thiourea (S═C(NH$_2$)$_2$), sodium sulfide hydrate (Na$_2$S, 9H$_2$O), sodium sulfide (Na$_2$S) potassium selenocyanate (K—Se—C≡N) and selenourea (Se═C(NH$_2$)$_2$); and the precursor(s) of doping agent(s) is/are selected from the group consisting of silver nitrate (AgNO$_3$), gallium chloride (GaCl$_3$), cadmium chloride (CdCl$_2$), gallium nitrate (Ga(NO$_3$)$_3$), cadmium nitrate (Cd(NO$_3$)$_3$), cadmium iodide (CdI$_2$) and lead acetate ((CH$_3$COO)$_4$Pb), yttrium nitrate (Y(NO$_3$)$_3$), gallium (oxy)hydroxides, lead (oxy)hydroxides and yttrium (oxy)hydroxides.

17. The process as claimed in claim 13, wherein the composition of precursors is subjected directly to the molten salt step.

18. The process as claimed in claim 13, further comprising after step (a):

preparing a solution, called the solution of precursors, by mixing the precursor(s) of each element constituting the solid material of formula (A) in a liquid medium, called the solvent medium, comprising at least one liquid compound selected from the group consisting of ethylene glycol, acetonitrile and alcohols; and then carrying out a treatment, called solvothermal treatment, of said solution of precursors in a closed reactor at a temperature of from 140° C. to 250° C. for a period of from 8 hours to 24 hours;

carrying out a step of solid/liquid separation of a solid residue formed during the solvothermal treatment in said solution of precursors;

grinding said solid in order to form a finely divided powder; and subjecting the finely divided powder to the molten salt step.

19. The process as claimed in claim 13, wherein, in the molten salt step, the rate of temperature increase of said vessel is from 1° C./minute to 2° C./minute and the synthesis temperature is from 350° C. to 460° C.

20. The process as claimed in claim 13, wherein the inert gas is selected from the group consisting of argon (Ar) and molecular nitrogen (N$_2$).

* * * * *